United States Patent
Choi et al.

(10) Patent No.: US 11,631,466 B2
(45) Date of Patent: Apr. 18, 2023

(54) STORAGE DEVICE PERFORMING READ OPERATION BY RESTORING ON CELL COUNT (OCC) FROM POWER LOSS PROTECTION AREA OF NON-VOLATILE MEMORY

(71) Applicant: SAMSUNG ELECTRONICS CO., LTD., Suwon-si (KR)

(72) Inventors: Sanghyun Choi, Seoul (KR); Youngdeok Seo, Seoul (KR); Kangho Roh, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 97 days.

(21) Appl. No.: 17/239,646

(22) Filed: Apr. 25, 2021

(65) Prior Publication Data
US 2022/0051730 A1 Feb. 17, 2022

(30) Foreign Application Priority Data
Aug. 14, 2020 (KR) .................. 10-2020-0102709

(51) Int. Cl.
*G06F 12/00* (2006.01)
*G11C 16/26* (2006.01)
(Continued)

(52) U.S. Cl.
CPC .............. *G11C 16/26* (2013.01); *G06F 3/064* (2013.01); *G06F 3/0619* (2013.01);
(Continued)

(58) Field of Classification Search
CPC .......... G06F 12/0871; G06F 12/1054; G06F 12/1063; G06F 2212/1024; G06F 12/0831; G06F 12/0888

USPC ........................................................ 711/103
See application file for complete search history.

(56) References Cited

U.S. PATENT DOCUMENTS

| 7,852,287 | B2 | 12/2010 | Yamada |
| 8,055,885 | B2 | 11/2011 | Nakashima |

(Continued)

FOREIGN PATENT DOCUMENTS

| CA | 2625795 A1 | * 10/2009 | ............. G06N 3/004 |
| JP | 2018147543 A | * 9/2018 | ......... G11C 11/5628 |
| KR | 10-20170086173 | 7/2017 | |
| KR | 10-20200055976 | 5/2020 | |
| KR | 10-20200057827 | 5/2020 | |

OTHER PUBLICATIONS

European Search Report dated Nov. 23, 2021 Cited in EP Patent Application No. 21184918.7.

*Primary Examiner* — Mardochee Chery
(74) *Attorney, Agent, or Firm* — Volentine, Whitt & Francos, PLLC

(57) ABSTRACT

A storage device performs a read operation by restoring an ON cell count (OCC) from a power loss protection (PLP) area of a nonvolatile memory. The nonvolatile memory includes a memory blocks, a buffer memory and a controller. The buffer memory stores a first ON cell count (OCC1) indicating a number of memory cells turned ON by a first read voltage and a second ON cell count (OCC2) indicating a number of memory cells turned ON by a second read voltage among the memory cells connected to a reference word line. The controller stores the OCC1 for each of the memory blocks in the PLP area when a sudden power off occurs in the storage device.

18 Claims, 20 Drawing Sheets

(51) Int. Cl.
*G06F 3/06* (2006.01)
*G06N 3/04* (2023.01)
*G06N 3/08* (2023.01)
*G11C 16/10* (2006.01)
*G11C 16/16* (2006.01)
*G11C 11/56* (2006.01)
*G11C 16/04* (2006.01)

(52) U.S. Cl.
CPC .......... *G06F 3/0659* (2013.01); *G06F 3/0679* (2013.01); *G06N 3/04* (2013.01); *G06N 3/08* (2013.01); *G11C 16/10* (2013.01); *G11C 16/16* (2013.01); *G11C 11/5671* (2013.01); *G11C 16/0483* (2013.01)

(56) References Cited

U.S. PATENT DOCUMENTS

| | | |
|---|---|---|
| 8,644,099 B2 | 2/2014 | Cometti et al. |
| 9,543,025 B2 | 1/2017 | Fitzpatrick et al. |
| 9,812,213 B2 | 11/2017 | Kim et al. |
| 10,114,584 B2 | 10/2018 | Gorobets et al. |
| 2004/0213038 A1* | 10/2004 | Maruyama ............... G11C 11/22 365/158 |
| 2016/0070336 A1 | 3/2016 | Kojima et al. |
| 2018/0024764 A1 | 1/2018 | Miller |
| 2018/0285006 A1* | 10/2018 | Torng ................. G11C 11/1675 |
| 2019/0087119 A1 | 3/2019 | Oh et al. |
| 2020/0151539 A1 | 5/2020 | Oh et al. |
| 2020/0152279 A1 | 5/2020 | Oh et al. |

\* cited by examiner

FIG. 10

BLK1 Data

| Input features | | | Labels |
|---|---|---|---|
| OCC1 (Ref WL) | OCC2 (Ref WL) | WL1 | Read Level Set of WL1 |
| OCC1 (Ref WL) | OCC2 (Ref WL) | WL2 | Read Level Set of WL2 |
| OCC1 (Ref WL) | OCC2 (Ref WL) | WL3 | Read Level Set of WL3 |
| OCC1 (Ref WL) | OCC2 (Ref WL) | WL4 (Ref WL) | Read Level Set of WL4 |
| OCC1 (Ref WL) | OCC2 (Ref WL) | WL5 | Read Level Set of WL5 |
| OCC1 (Ref WL) | OCC2 (Ref WL) | WL6 | Read Level Set of WL6 |

...

| OCC1 (Ref WL) | OCC2 (Ref WL) | WL64 | Read Level Set of WL64 |

(Read Level 1) (Read Level 2) (Target WL #)

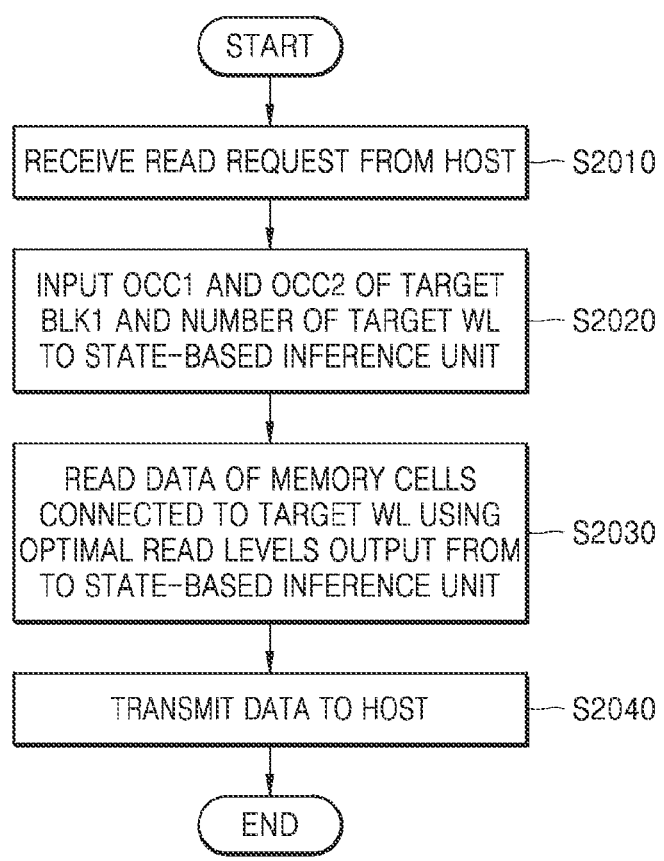

STORAGE DEVICE PERFORMING READ OPERATION BY RESTORING ON CELL COUNT (OCC) FROM POWER LOSS PROTECTION AREA OF NON-VOLATILE MEMORY

CROSS-REFERENCE TO RELATED APPLICATION

This application claims priority under 35 U.S.C. § 119 to Korean Patent Application No. 10-2020-0102709 filed on Aug. 14, 2020 in the Korean Intellectual Property Office, the subject matter of which is hereby incorporated by reference.

BACKGROUND

Embodiments of the inventive concept relate generally to semiconductor memory devices. More particularly, embodiments of the inventive concept relate to storage devices performing read operations by storing and restoring an ON cell count (OCC) value that has been changed due to retention deterioration in and from a power loss protection area of a nonvolatile memory. Embodiments of the inventive concept also relate to operating methods for such storage devices.

Many storage devices include at least one nonvolatile memory. As the data storage capacity of the storage device increases, the number of memory cells and word lines stacked on a substrate of the nonvolatile memory also increase, along with the number of stored data bits.

As is understood by those skilled in the art, the integrity of data stored in a nonvolatile memory tends to deteriorate due to a variety of causes, often depending on usage pattern, operating environment, etc. A storage device may overcome deterioration by changing operating conditions of the nonvolatile memory. So, changed operating conditions may be determined and set in advance based (e.g.,) on expected an usage pattern and operating environment. However, this approach does not overcome a problem in which the threshold voltage distribution of memory cells tends to shift across different word lines.

Accordingly, it is necessary to monitor the deterioration state of the nonvolatile memory and change the operating conditions according to the monitored degree of deterioration. However, even when the storage device performs a read operation using changed operating conditions (e.g., performing the read operation in relation to a stored OCC value undergoing change due to retention deterioration in nonvolatile memory and restoring the OCC from the nonvolatile memory), it may be beneficial to seek additional improvement in overall read performance (e.g., reducing the time required for the output of read data).

SUMMARY

According to an aspect of the inventive concept, there is provided a storage device including; a nonvolatile memory comprising memory blocks including a first memory block and a second memory block, a buffer memory configured to apply a first read voltage having a first read level and a second read voltage having a second read level higher than the first read level to memory cells connected to a reference word line for each of the memory blocks, and store a first ON cell count (OCC1) indicating a number of memory cells turned ON by the first read voltage and a second ON cell count (OCC2) indicating the number of memory cells turned ON by the second read voltage among the memory cells connected to the reference word line, and a controller storing the OCC1 for each of the memory blocks in a power loss protection (PLP) area of the nonvolatile memory when a sudden power off occurs in the storage device.

According to an aspect of the inventive concept, there is provided a storage device including; a nonvolatile memory comprising memory blocks including a first memory block and a second memory block, a buffer memory configured to apply a first read voltage having a first read level and a second read voltage having a second read level higher than the first read level to memory cells connected to a reference word line for each of the memory blocks, and store a first ON cell count (OCC1) indicating a number of memory cells turned ON by the first read voltage, a second ON cell count (OCC2) indicating the number of memory cells turned ON by the second read voltage among the memory cells connected to the reference word line, and an artificial neural network (ANN) model, and a controller configured to input the OCC1, the OCC2, and a number of a target word line for a target memory block among the memory blocks to the ANN model, calculate read levels for determining data of memory cells connected to the target word line, and store the OCC1 for each of the memory blocks in a power loss protection (PLP) area of the nonvolatile memory when a sudden power off occurs in the storage device.

According to an aspect of the inventive concept, there is provided an operating method for a storage device comprising a memory blocks including a first memory block and a second memory block. The operating method includes; monitoring a first ON cell count (OCC1) and a second ON cell count (OCC2) for each of the memory blocks, wherein the OCC1 applies a first read voltage having a first read level to memory cells connected to a reference word line for each of the memory blocks and indicates a number of memory cells turned ON by the first read voltage, and the OCC2 applies a second read voltage having a second read level higher than the first read level to the memory cells connected to the reference word line for each of the memory blocks and indicates a number of memory cells turned ON by the second read voltage among the memory cells connected to the reference word line, storing the OCC1 and the OCC2 for each of the memory blocks in a buffer memory, and storing the OCC1 for each of the memory blocks in a power loss protection (PLP) area of the nonvolatile memory when a sudden power off of the storage device occurs.

BRIEF DESCRIPTION OF THE DRAWINGS

Embodiments of the inventive concept will be more clearly understood from the following detailed description taken in conjunction with the accompanying drawings in which:

FIG. 10 is a table listing exemplary block data groups for the training data of FIG. 9;

FIGS. 18, 19 and 20 are respective flowcharts variously illustrating example of an operating method for the storage device of FIG. 12.

DETAILED DESCRIPTION

Throughout the written description and drawings, like reference numbers and labels are used to denote like or similar elements and/or features.

Figure 1:
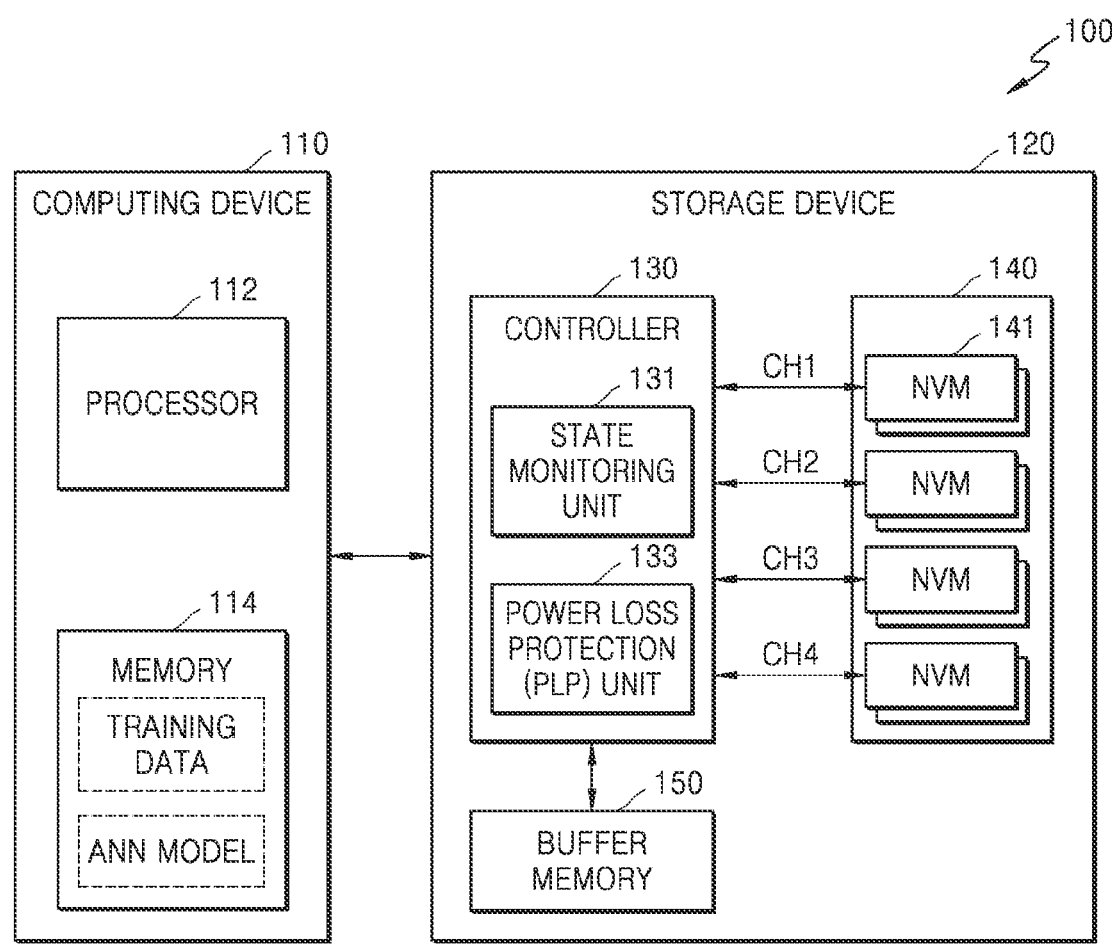
FIG. 1 is a block diagram illustrating a memory system according to embodiments of the inventive concept.

FIG. 1 is a block diagram illustrating a memory system 100 according to embodiments of the inventive concept.

Referring to FIG. 1, the memory system 100 may generally include a computing device 110 and a storage device 120, wherein the computing device 110 variously communicates with the storage device 120. For example, the computing device 110 may train an artificial neural network (ANN) model executed by the storage device 120. Accordingly, the computing device 110 may include training data for learning of the ANN model. In some embodiments, the computing device 110 may be a deep learning server specialized in executing or implementing the ANN model. In the illustrated example of FIG. 1, the computing device 110 includes a processor 112 and a memory 114.

The processor 112 may include a central processing unit (CPU), a graphics processing unit (GPU), a neural processing unit (NPU), a digital signal processor (DSP), and the like, and the number of processors 112 may be one or more, that is, a multi-core processor. The memory 114 may be a storage medium capable of storing the ANN model and the training data. The ANN model may be configured in the form of program code executed by the processor 112. The training data may include input data provided to the ANN model and output data output from the ANN model. The memory 114 may include volatile memory such as static random access memory (SRAM) and dynamic random access memory (DRAM), and/or nonvolatile memory such as flash memory, RRAM, MRAM, PRAM, and FRAM.

In the illustrated example of FIG. 1, the storage device 120 may include a controller 130, a nonvolatile memory 140, and a buffer memory 150. Here, for example, the storage device 120 may include a solid state drive or solid state disk (SSD), universal flash storage (UFS), a memory card, a micro SD card, an embedded multi-media (eMMC) card, and the like, but the scope of the inventive concept is not limited thereto.

The controller 130 may process a request received from the computing device 110. The controller 130 may perform a write operation (or a program operation), a read operation, and/or an erase operation in relation to the nonvolatile memory 140 in response to various request(s) received from the computing device 110. In this regard, the controller 130 may control the overall operation of the nonvolatile memory 140 and the buffer memory 150. The controller 130 may be implemented using a system on chip (SoC), an application specific integrated circuit (ASIC), and a field programmable gate array (FPGA).

Accordingly, the nonvolatile memory 140 may perform the write operation, the read operation, and/or the erase operation under the control of the controller 130. The nonvolatile memory 140 may include a plurality of nonvolatile memory devices (hereinafter, "NVM devices") respectively connected to a plurality of channels CH1 to CH4. In some embodiments, each of the NVM devices may include at least one NAND flash memory.

The NVM devices may be connected to the controller 130 through a plurality of channels CH1 to CH4. In FIG. 1, the number of channels is assumed to be four (4), however, the inventive concept is not limited thereto. Each of the NVM devices may receive a write command, an address, and data from the controller 130, and may write data to memory cells corresponding to the address. Each of the NVM devices may receive a read command and an address from the controller 130, read data from memory cells corresponding to the address, and output the read data to the controller 130. Each of the NVM devices may receive an erase command and an address from the controller 130 and may erase data of memory cells corresponding to the address. One example of the NVM devices will be described in some additional detail in relation to FIG. 3, hereafter.

The controller 130 may operate in relation to one or more memory blocks included in the NVM devices in at least one of a single level cell (SLC) mode, a multi level cell (MLC) mode, a triple level cell (TLC) mode and a quad level cell (QLC) mode, for example. In the illustrated example of FIG. 1, the controller 130 includes a state monitoring unit 131 and a power loss protection (PLP) unit 133.

The state monitoring unit 131 may be used to monitor a deterioration state for each of the memory blocks in the NVM devices. The state monitoring unit 131 may monitor various OCCs for memory cells connected to a reference word line of the memory blocks included in the NVM devices using read levels. The state monitoring unit 131 may monitor at least two OCCs, that is, a first OCC (OCC1) and a second OCC (OCC2), for each of the memory blocks. In this regard, the state monitoring unit 131 may store an OCC1 and an OCC2 for each of the memory blocks in the buffer memory 150.

The PLP unit 133 may perform a PLP operation in response to a request from a host or the computing device 110 using (e.g.,) auxiliary power of the storage device 120 when a sudden power off event occurs in the storage device 120. In this regard, the term "unit(s)" may referred to circuit(s), processor(s), and the like.

The buffer memory 150 may include SRAM, DRAM, or tightly coupled memory (TCM). Unlike the example shown in FIG. 1, the buffer memory 150 may be implemented within the controller 130.

Although the capacity of the buffer memory 150 is less than that of the nonvolatile memory 140, the buffer memory 150 may provide improved waiting time, access time, and overall improved operating speed(s), as compared with the nonvolatile memory 140. The buffer memory 150 may be used to store information and/or programs controlling and/or managing the nonvolatile memory 140. For example, the buffer memory 150 may store a mapping table indicating relationships between logical addresses of the host and physical addresses of the nonvolatile memory 140. Payload or bulk data may generally be stored in the nonvolatile memory 140, but may be written (or programmed) to or read from the nonvolatile memory 140 through the buffer memory 150. In some embodiments, the buffer memory 150 may store OCCs for each of the memory blocks in the NVM devices, as periodically monitored and maintained during a background operation of the storage device 120 (See, e.g., S1400 of FIG. 4).

Figure 2:
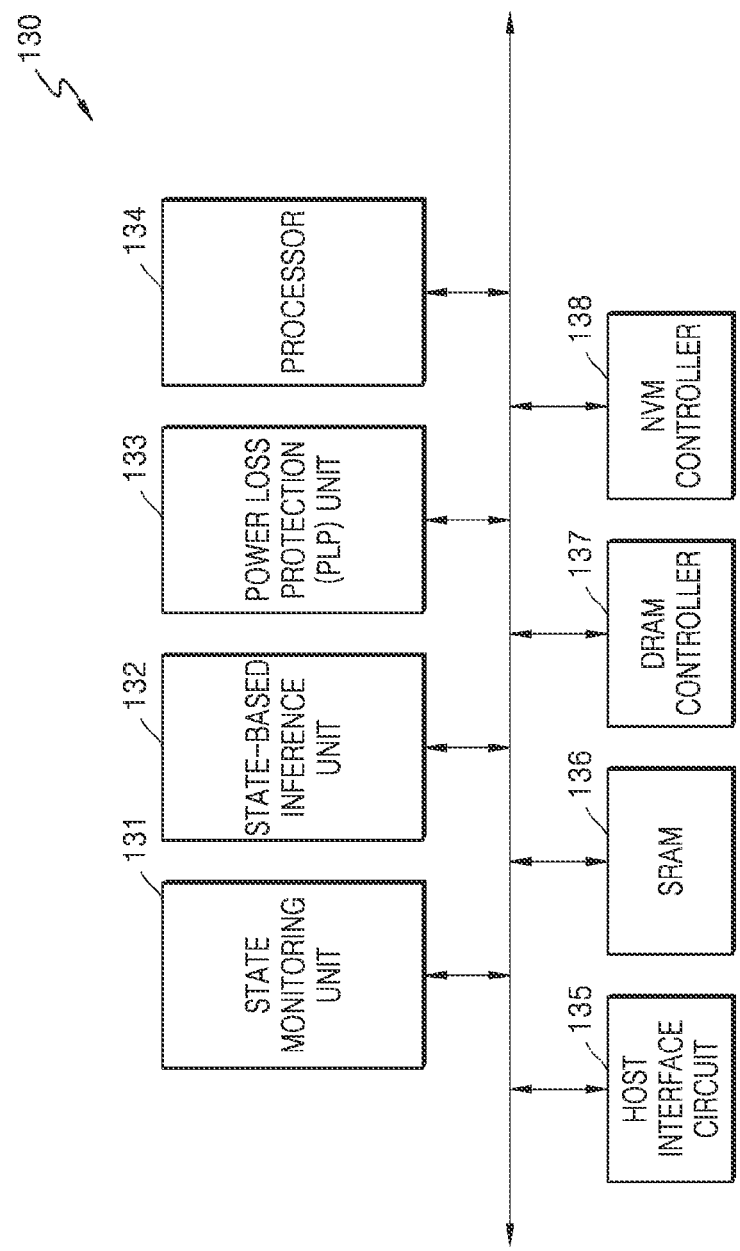
FIG. 2 is a block diagram further illustrating in one example the controller 130 of FIG. 1.

FIG. 2 is a block diagram further illustrating in one example the controller 130 of FIG. 1.

Referring to FIGS. 1 and 2, the controller 130 may further include a state-based inference unit 132, a processor 134, a host interface circuit 135, SRAM 136, a DRAM controller 137 and an NVM controller 138—in addition to the state monitoring unit 131 and the PLP unit 133 previously described.

The state-based inference unit 132 may logically "infer" operating conditions associated with each of the memory blocks based on a deterioration state of each of the memory blocks monitored by the state monitoring unit 131. The state-based inference unit 132 may infer or calculate optimal read levels with respect to a target word line using OCC1 and OCC2 for each of the memory blocks in the ANN model.

In this regard, the processor 134 may control the operation of the controller 130 and may perform various logical operations. In FIG. 2, the state monitoring unit 131, the state-based inference unit 132, and the processor 134 are assumed to be separately embodied (or identifiable), however in some embodiments, the state monitoring unit 131 and the state-based inference unit 132 may be integrated within the computational capabilities of the processor 134. When the state monitoring unit 131 and the state-based inference unit 132 are implemented in software (e.g., in program code), the processor 134 may describe the operation of the state monitoring unit 131 and the state-based inference unit 132 and execute program code stored in the SRAM 136, the DRAM, and/or the buffer memory 150.

The host interface circuit 135 may communicate with an external host under the control of the processor 134. Here, the host interface circuit 135 may use at least one of various communication methods such as Universal Serial Bus (USB), Serial Advanced Technology Attachment (SATA), external SATA (e-SATA), Small Computer Small Interface (SCSI), serial attached SCSI (SAS), Peripheral Component Interconnection (PCI), PCI express (PCIe), Non-Volatile Memory express (NVMe), Universal Flash Storage (UFS), Secure Digital (SD), Multi Media Card (MMC), embedded MMCti (eMMC), and the like.

The SRAM 136 may be used as a cache memory of the processor 134. The SRAM 136 may store code and instructions executed by the processor 134 and may store data processed by the processor 134. The SRAM 136 may store program code in which the state monitoring unit 131 and the state-based inference unit 132 are described, a flash transform layer (FTL), or various memory management modules. The FTL may perform functions such as address mapping, garbage collection, and wear leveling on the nonvolatile memory 140.

The DRAM controller 137 may control the DRAM included in the storage device 120 under the control of the processor 134. The DRAM controller 137 may communicate with the DRAM by using a direct memory access (DMA) method. The DRAM included in the storage device 120 and communicating with the DRAM controller 137 may constitute the buffer memory 150 together with the SRAM 136.

The NVM controller 138 may control the nonvolatile memory 140 to read memory cells connected to a reference word line of a memory blocks included in a NVM devices by using read levels under the control of the state monitoring unit 131 or the processor 134. The NVM controller 138 may receive a read result or read data from the nonvolatile memory 140 and provide the read result or the read data to the state monitoring unit 131. The NVM controller 138 may control the nonvolatile memory 140 to read memory cells connected to a target word line using optimal read levels under the control of the state-based inference unit 132 or the processor 134. The NVM controller 138 may receive data read from the nonvolatile memory 140 based on the optimal read levels.

Figure 3:
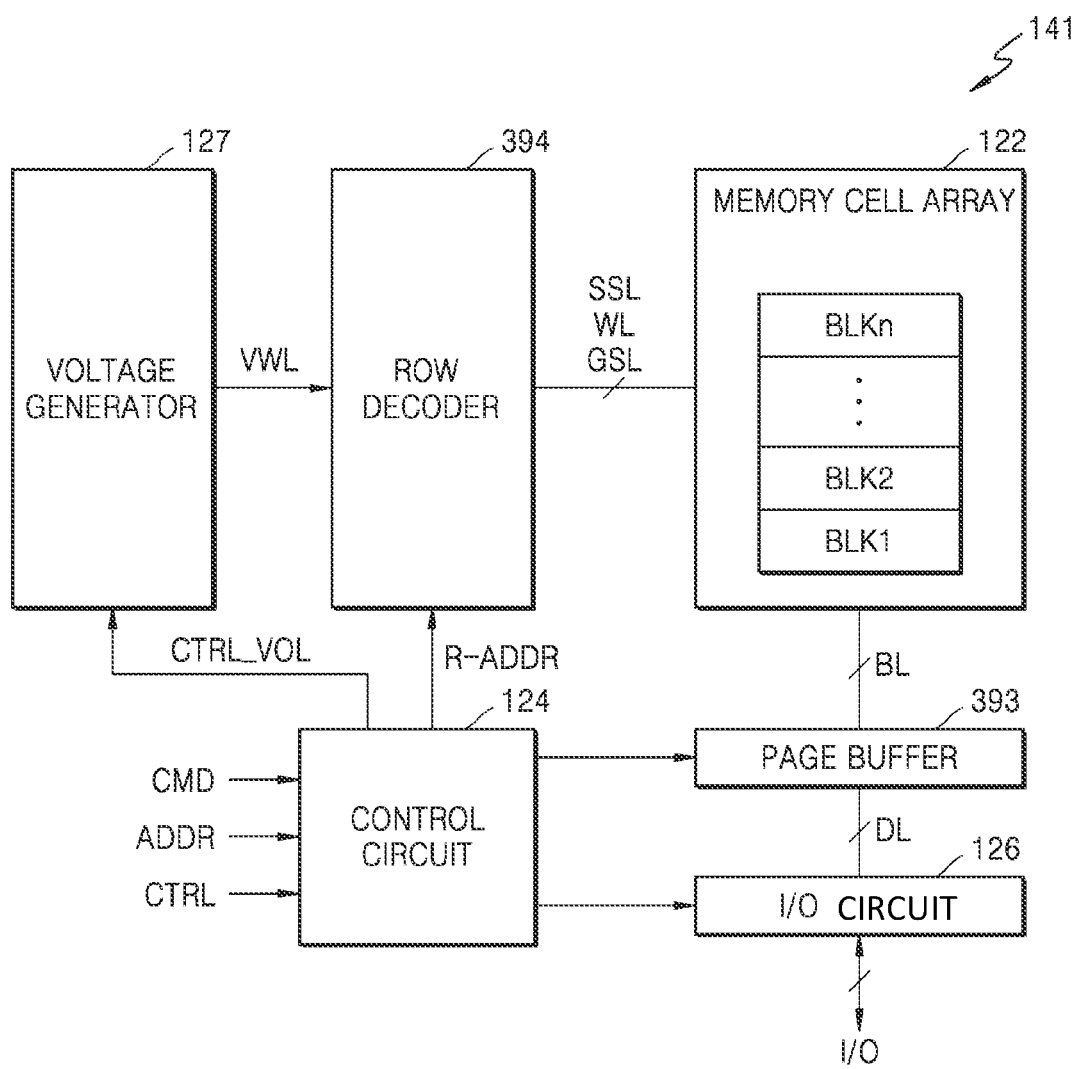
FIG. 3 is a block diagram further illustrating in one example the nonvolatile memory (NVM) device 141 of FIG. 1.

FIG. 3 is a block diagram further illustrating in one example the NVM device 141 of FIG. 1. Here, the NVM device 141 is assumed to representatively described each one of the NVM devices Referring to FIG. 3, the NVM device 141 may include a memory cell array 122, a row decoder 394, a control circuit 124, a page buffer 393, an input/output (I/O) circuit 126, and a voltage generator 127. Although not shown in FIG. 3, the NVM device 141 may further include one or more I/O interface(s).

The memory cell array 122 may be connected to word lines WL, string select lines SSL, ground select lines GSL, and bit lines BL. The memory cell array 122 may be connected to the row decoder 394 through the word lines WL, the string select lines SSL, and the ground select lines GSL, and may be connected to the page buffer 393 through the bit lines BL. The memory cell array 122 may include memory blocks BLK1 to BLKn.

Each of the memory blocks BLK1 to BLKn may include memory cells and select transistors. The memory cells may be connected to the word lines WL, and the select transistors may be connected to the string select lines SSL or the ground select lines GSL. The memory cells of each of the memory blocks BLK1 to BLKn may include SLC, MLC, TLC, or QLC under the control of the controller 130.

Hereinafter, embodiments of the inventive concept will be described under an assumption that the memory cells are NAND flash memory cells, however the inventive concept is not limited thereto. The memory cell array 122 may include a three-dimensional (3D) memory cell array including cell strings—examples of are described hereafter in relation to FIGS. 4 and 5.

In this context, a 3D memory cell array may be a circuit associated with an active region disposed on a silicon substrate and operations of the memory cells and is formed monolithically on the substrate or at least one physical level of memory cell arrays having a circuit formed in the substrate. The term "monolithic" means that layers of each level constituting the array are stacked directly above the layers of each lower level of the array. In some embodiments, the 3D memory cell array may include cell strings arranged in a "vertical" direction (e.g., a Z-axis direction. This definition of the vertical direction assumes two "horizontal" directions (e.g., a first horizontal direction and a second horizontal direction) that define a constituent horizontal plane in relation to the vertical direction, such that one memory cell may be vertically disposed above another memory cell. Here, the one memory cell may include a charge trap layer. Further in this regard, U.S. Pat. Nos. 7,679,133; 8,553,466; 8,654,587; and 8,559,235, as well as published U.S. Patent Application No. 2011/0233648 describe exemplary configurations of a 3D memory array including a number of levels and sharing word lines and/or bit lines between the levels. The collective subject matter of these documents is hereby incorporated by reference.

The row decoder 394 may select one of the memory blocks BLK1 to BLKn of the memory cell array 122, select one of the word lines WL of the selected memory block, and select one of the plurality of string select lines SSL.

The control circuit 124 may output various internal control signals for performing program, read, and erase operations on the memory cell array 122 based on a command CMD, an address ADDR, and a control signal CTRL transmitted from the controller 130. The control circuit 124 may provide a row address R_ADDR to the row decoder 394, a column address to the I/O circuit 126, and a voltage control signal CTRL_VOL to the voltage generator 127.

The page buffer 393 may operate as a write driver or a sense amplifier according to an operation mode. During the read operation, the page buffer 393 may sense data of the bit line BL of the selected memory cell under the control of the control circuit 124. The sensed data may be stored in latches included in the page buffer 393. The page buffer 393 may dump the data stored in the latches to the I/O circuit 126 through a data line DL under the control of the control circuit 124.

The I/O circuit 126 may temporarily store the command CMD, the address ADDR, and data DATA provided from the outside of the NVM device 141 through the I/O circuit 126. Here, the I/O circuit 126 may temporarily store read data of the NVM device 141 and output the data to the outside through an I/O line at a designated time.

The voltage generator 127 may generate various types of voltages for performing the program, read, and erase operations on the memory cell array 122 based on the voltage control signal CTRL_VOL. That is, the voltage generator 127 may generate a word line voltage VWL, for example, a program voltage, a detection read voltage, a read voltage, a pass voltage, an erase voltage, an erase verification voltage, and the like.

Figure 4:
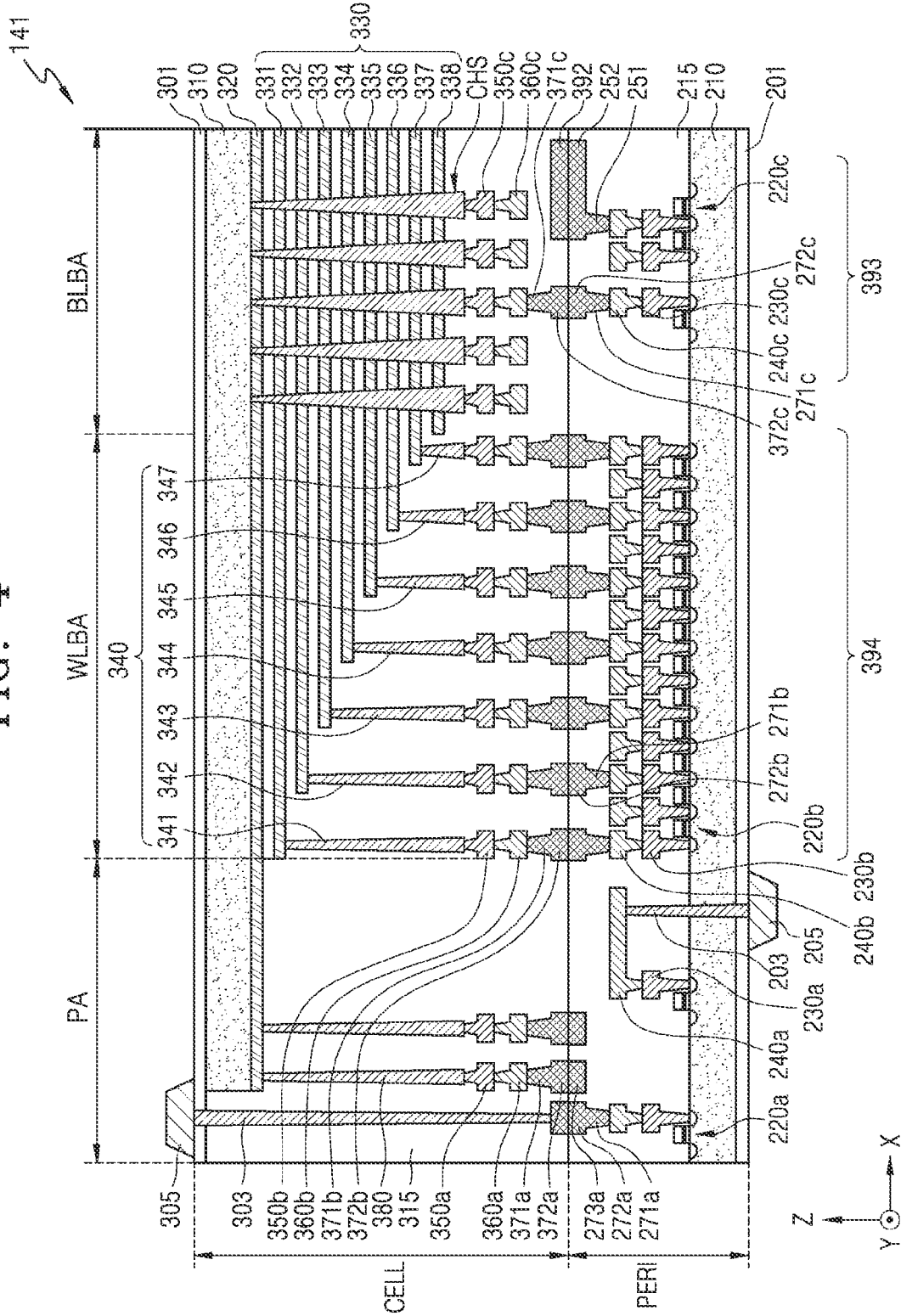
FIG. 4 is a cross-sectional diagram further illustrating in one example the memory device 141 of FIG. 3.

FIG. 4 is a cross-sectional diagram further illustrating in one example the memory device 141 of FIG. 3 according to embodiments of the inventive concept.

Referring to FIG. 4, the memory device 141 is assumed to have a chip-to-chip (C2C) structure. Here, the C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 141 may include an external pad bonding area PA, a word line bonding area WLBA, and a bit line bonding area BLBA.

The peripheral circuit region PERI may include a first substrate 210, an interlayer insulating layer 215, circuit elements 220a, 220b, and 220c formed on the first substrate 210, first metal layers 230a, 230b, and 230c respectively connected to the circuit elements 220a, 220b, and 220c, and second metal layers 240a, 240b, and 240c formed on the first metal layers 230a, 230b, and 230c. In an example embodiment, the first metal layers 230a, 230b, and 230c may be formed of tungsten having relatively high electrical resistivity, and the second metal layers 240a, 240b, and 240c may be formed of copper having relatively low electrical resistivity.

In the illustrated example of FIG. 4, although only the first metal layers 230a, 230b, and 230c and the second metal layers 240a, 240b, and 240c are shown and described, the example embodiment is not limited thereto, and one or more additional metal layers may be further formed on the second metal layers 240a, 240b, and 240c. At least a portion of the one or more additional metal layers formed on the second metal layers 240a, 240b, and 240c may be formed of aluminum or the like having a lower electrical resistivity than those of copper forming the second metal layers 240a, 240b, and 240c.

The interlayer insulating layer 215 may be disposed on the first substrate 210 and cover the circuit elements 220a, 220b, and 220c, the first metal layers 230a, 230b, and 230c, and the second metal layers 240a, 240b, and 240c. The interlayer insulating layer 215 may include an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically bonded to upper bonding metals 371b and 372b of the cell region CELL. The lower bonding metals 271b and 272b and the upper bonding metals 371b and 372b may be formed of aluminum, copper, tungsten, or the like. Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. Word lines 331 to 338 (i.e., 330) may be vertically stacked (i.e., arranged in the vertical direction) on the second substrate 310, perpendicular to an (horizontally disposed) upper surface of the second substrate 310. At least one string select line and at least one ground select line may be arranged on and below the word lines 330, respectively, and the word lines 330 may be disposed between the at least one string select line and the at least one ground select line.

In the bit line bonding area BLBA, a channel structure CH may extend in the vertical perpendicular to the upper surface of the second substrate 310, and pass through the word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in the first horizontal direction (e.g., a Y-axis direction) parallel to the upper surface of the second substrate 310.

In the illustrated example of FIG. 4, an area in which the channel structure CH, the bit line 360c, and the like are disposed may be defined as the bit line bonding area BLBA.

In the bit line bonding area BLBA, the bit line 360c may be electrically connected to the circuit elements 220c providing a page buffer 393 in the peripheral circuit region PERI. The bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the word lines 330 may extend in the second horizontal direction (e.g., an X-axis direction), parallel to the upper surface of the second substrate 310 and perpendicular to the first horizontal direction, and may be connected to cell contact plugs 341 to 347 (i.e., 340). The word lines 330 and the cell contact plugs 340 may be connected to each other in pads provided by at least a portion of the word lines 330 extending in different lengths in the second horizontal direction. A first metal layer 350b and a second metal layer 360b may be connected to an upper portion of the cell contact plugs 340 connected to the word lines 330, sequentially. The cell contact plugs 340 may be connected to the peripheral circuit region PERI by the upper bonding metals 371b and 372b of the cell region CELL and the lower bonding metals 271b and 272b of the peripheral circuit region PERI in the word line bonding area WLBA.

The cell contact plugs 340 may be electrically connected to the circuit elements 220b forming a row decoder 394 in the peripheral circuit region PERI. In an example embodiment, operating voltages of the circuit elements 220b of the row decoder 394 may be different than operating voltages of the circuit elements 220c forming the page buffer 393. For example, operating voltages of the circuit elements 220c forming the page buffer 393 may be greater than operating voltages of the circuit elements 220b forming the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

I/O pads 205 and 305 may be disposed in the external pad bonding area PA. Referring to FIG. 4, a lower insulating film 201 covering a lower surface of the first substrate 210 may be formed below the first substrate 210, and a first I/O pad 205 may be formed on the lower insulating film 201. The first I/O pad 205 may be connected to at least one of the circuit elements 220a, 220b, and 220c disposed in the peripheral circuit region PERI through a first I/O contact plug 203, and may be separated from the first substrate 210 by the lower insulating film 201. In addition, a side insulating film may be disposed between the first I/O contact plug 203 and the first substrate 210 to electrically separate the first I/O contact plug 203 and the first substrate 210.

Referring to FIG. 4, an upper insulating film 301 covering the upper surface of the second substrate 310 may be formed on the second substrate 310, and the second I/O pad 305 may be disposed on the upper insulating layer 301. The second I/O pad 305 may be connected to at least one of the circuit elements 220a, 220b, and 220c disposed in the peripheral circuit region PERI through a second I/O contact plug 303.

In the example embodiment, the second I/O pad 305 is electrically connected to a circuit element 220a.

According to embodiments, the second substrate 310 and the common source line 320 may not be disposed in an area in which the second I/O contact plug 303 is disposed. Also, the second I/O pad 305 may not overlap the word lines 330 in the vertical direction. Referring to FIG. 4, the second I/O contact plug 303 may be separated from the second substrate 310 in a horizontal direction, parallel to the upper surface of the second substrate 310, and may pass through the interlayer insulating layer 315 of the cell region CELL to be connected to the second I/O pad 305.

According to embodiments, the first I/O pad 205 and the second I/O pad 305 may be selectively formed. For example, the memory device 141 may include only the first I/O pad 205 disposed on the first substrate 210 or the second I/O pad 305 disposed on the second substrate 310. Alternatively, the memory device 141 may include both the first I/O pad 205 and the second I/O pad 305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 141 may include a lower metal pattern 273a, corresponding to an upper metal pattern 372a formed in an uppermost metal layer of the cell region CELL, and having the same cross-sectional shape as the upper metal pattern 372a of the cell region CELL so as to be connected to each other, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern 372a, corresponding to the lower metal pattern 273a formed in an uppermost metal layer of the peripheral circuit region PERI, and having the same shape as a lower metal pattern 273a of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu-to-Cu bonding.

Further, in the bit line bonding area BLBA, an upper metal pattern 392, corresponding to a lower metal pattern 252 formed in the uppermost metal layer of the peripheral circuit region PERI, and having the same cross-sectional shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

Figure 5:
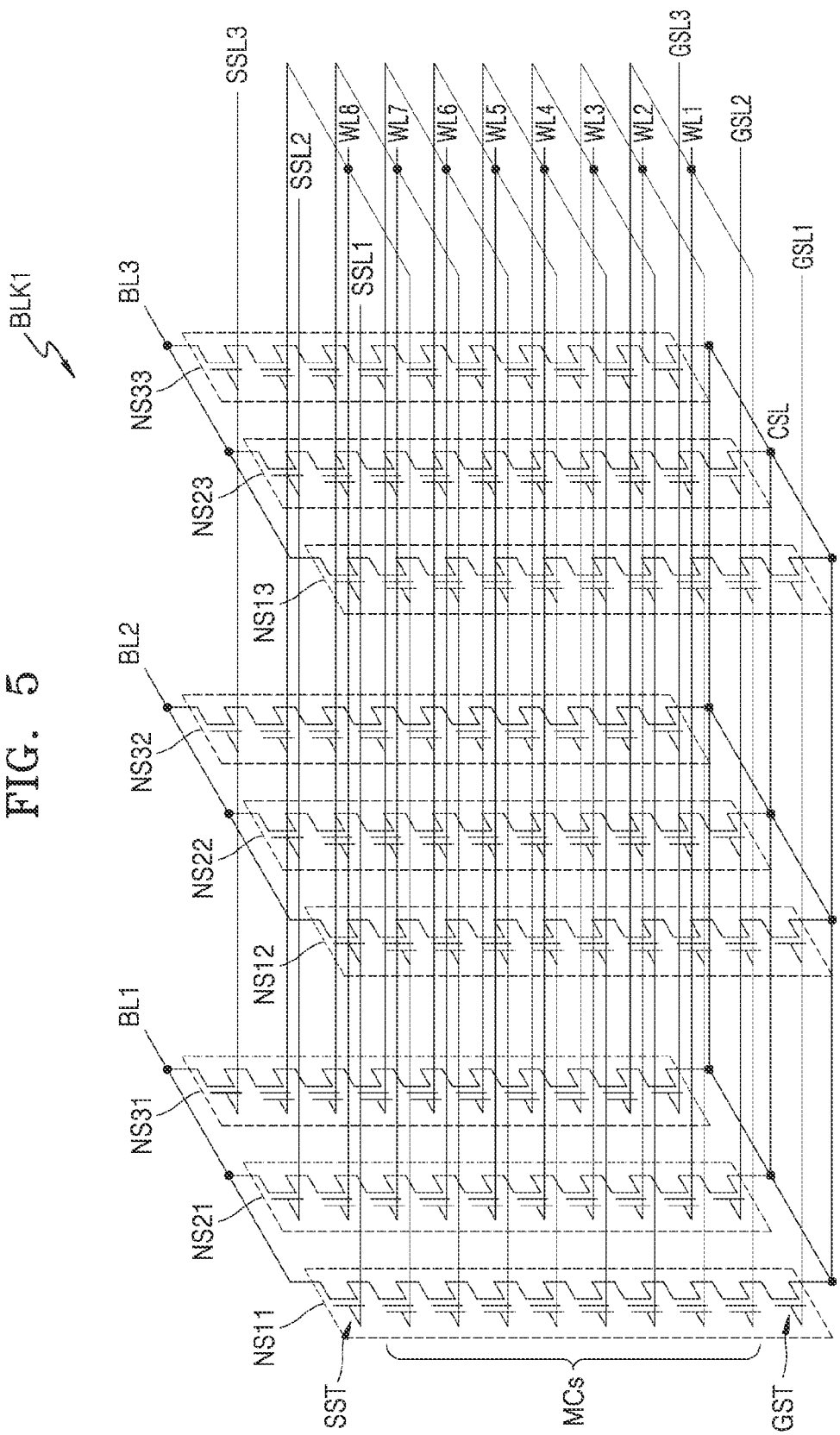
FIG. 5 is an equivalent circuit diagram of the first memory block BLK1 of FIG. 3.

FIG. 5 is an equivalent circuit diagram for the first memory block BLK1 of FIG. 3, and may be considered an example of one or more of the memory blocks BLK1 to BLKn described with reference to FIG. 3. Here, the first memory block BLK1 is assumed to be a 3D memory block having a 3D structure in relation to a primary (horizontally disposed) substrate. Memory cell strings included in the first memory block BLK1 may be formed in the vertical direction perpendicular to the substrate.

Referring to FIG. 5, the first memory block BLK1 may include NAND strings NS11 to NS33, word lines WL1 to WL8, bit lines BL1 to BL3, and ground select lines GSL1 to GSL3, string select lines SSL1 to SSL3, and a common source line CSL. In FIG. 5, each of the cell strings NS11 to NS33 includes eight memory cells MCs respectively connected to the eight word lines WL1 to WL8, but the inventive concept is not limited thereto.

Each cell string (e.g., NS11) may include a string select transistor SST, the memory cells MCs, and a ground select transistor GST connected in series. The string select transistor SST is connected to the corresponding string select line SSL1. The memory cells MCs are connected to the corresponding word lines WL1 to WL8, respectively. The ground select transistor GST is connected to the corresponding ground select line GSL1. The string select transistor SST is connected to the corresponding bit lines BL1 to BL3, and the ground select transistor GST is connected to the common source line CSL.

According to an embodiment, in each cell string, one or more dummy memory cells may be provided between the string select transistor SST and the memory cells MCs. In each cell string, one or more dummy memory cells may be provided between the ground select transistor GST and the memory cells MCs. In each cell string, one or more dummy memory cells may be provided between the memory cells MCs. The dummy memory cells may have the same structure as the memory cells MCs, and may not be programmed (e.g., program prohibited) or may be programmed differently from the memory cells MCs. For example, when the memory cells MCs are programmed to have two or more threshold voltage distributions, the dummy memory cells may be programmed to have one threshold voltage distribution range or a smaller number of threshold voltage distributions than those of the memory cells MCs.

Figure 6:
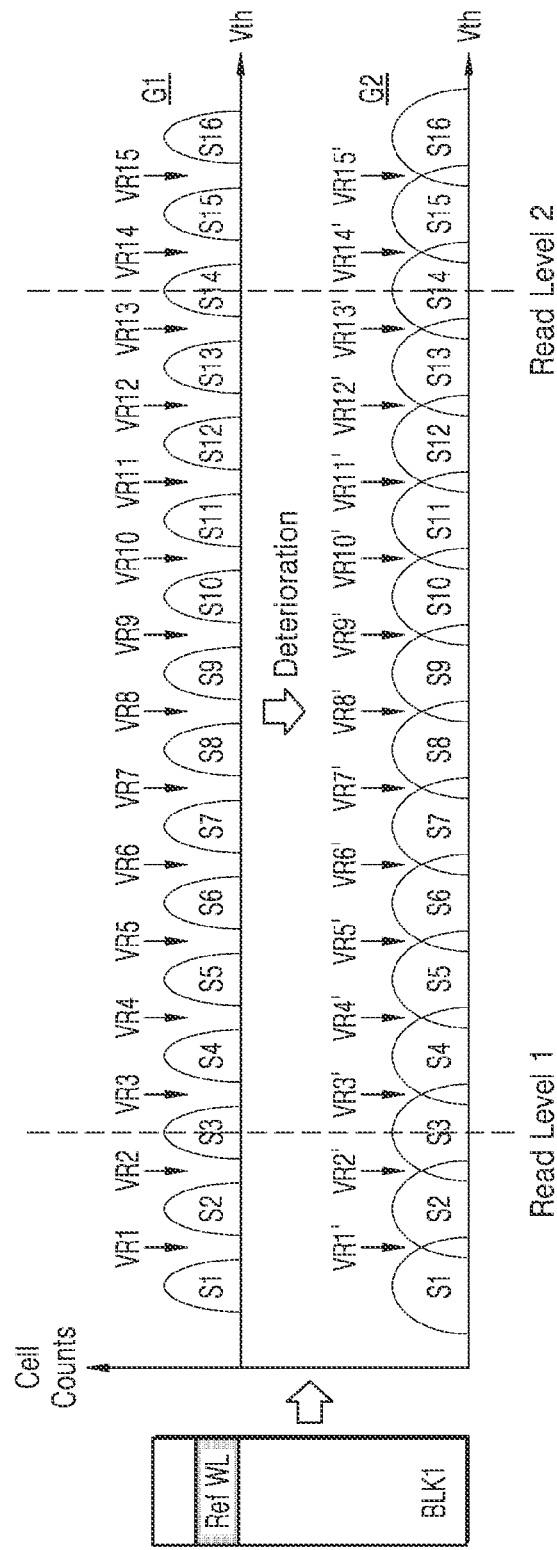
FIGS. 6 and 7 are respective sets of graphs variously illustrating exemplary threshold voltage distributions for memory cells of a memory system according to embodiments of the inventive concept.

FIG. 6 includes respective graphs G1 and G2 collectively illustrating an undesired shift in threshold voltage distribution(s) for the memory cells of FIGS. 4 and 5. In FIG. 6, graphs G1 and G2 represent distributions of threshold voltages of memory cells connected to a reference word line Ref WL in the first memory block BLK1. Here, the horizontal axis represents the threshold voltages of memory cells, and the vertical axis represents cell counts, that is, a number of memory cells.

Referring to FIG. 6, one or more bits may be programmed in the memory cell connected to the reference word line Ref WL. The memory cells may be classified into SLC, MLC, TLC, or QLC according to the number of bits stored in the memory cells. The memory cell may be programmed into one of a number of states according to the number of bits stored in the memory cell. The states may be defined as a range of a threshold voltage. In FIG. 6, the memory cell is a QLC, and the threshold voltage of the memory cell may be programmed in one of 16 states S1 to S16.

After data is programmed in the memory cell, disturbance deterioration or retention deterioration may occur in the memory cell. Disturbance deterioration means a phenomenon in which threshold voltages of memory cells change due to programming, reading, erasing, coupling, etc. occurring around the memory cells. Retention deterioration means a phenomenon in which charges are trapped in a charge trapping layer of the memory cell and the memory cell is programmed, and then the trapped charges leak over time and thus threshold voltages of the memory cells change. When deterioration occurs in the memory cell, because the threshold voltages of the memory cell change, if initially set read levels are used, data of the memory cell may not be read (i.e., data is damaged).

In FIG. 6, when the memory cells show the distribution of threshold voltages such as the graph G1, optimal read levels for reading data stored in the memory cells may be VR1 to VR15. Due to deterioration, the graph G1 may change or move to the graph G2. When the memory cells show the distribution of threshold voltages such as the graph G2, the optimal read levels for reading data stored in the memory cells may be VR1' to VR15' other than VR1 to VR15.

The state monitoring unit 131 may apply first and second read levels Read Level 1 and Read Level 2 for obtaining OCC1 and OCC2 to the reference word line Ref WL to read the memory cells connected to the reference word line Ref WL. Here, the first and second read levels Read Level 1 and Read Level 2 for obtaining OCC1 and OCC2 may be different from the read levels VR1 to VR15 or VR1' to VR15'. The first and second read levels Read Level 1 and Read Level 2 for obtaining OCC1 and OCC2 may be applied to the reference word line Ref WL according to an SLC read operation. Meanwhile, the read levels VR1 to VR15 or VR1' to VR15' for reading data may be applied to the word line according to a QLC read operation.

The state monitoring unit 131 may obtain OCC1 and OCC2 of the reference word line Ref WL. The state monitoring unit 131 may obtain OCC1 and OCC2 when the memory cells have the distribution of threshold voltages such as the graph G1 by using the first and second read levels Read Level 1 and Read Level 2. In addition, the state monitoring unit 131 may obtain OCC1 and OCC2 when the memory cells have the distribution of threshold voltages such as the graph G2 by using the first and second read levels Read Level 1 and Read Level 2. The state monitoring unit 131 may monitor a deterioration state of the memory cells based on changes in OCC1 and OCC2 as the graph G1 changes to the graph G2 due to deterioration.

The state-based inference unit 132 may infer the optimal read levels VR1 to VR15 of the reference word line Ref WL based on OCC1 and OCC2 according to the graph G1. Further, the state-based inference unit 132 may infer the optimal read levels VR1' to VR15' of the reference word line Ref WL based on OCC1 and OCC2 according to the graph G2. The state-based inference unit 132 may infer optimal read levels of a word line other than the reference word line Ref WL based on OCC1 and OCC2 and a number of the other word line. The state-based inference unit 132 may infer optimal read levels based on OCC1 and OCC2 representing the deterioration state of a block, and thus the number of read retries repeatedly performed during a read operation using different read levels, as well as the number of read reclaims associated with a backing-up of data from one block to another block may be reduced.

The first and second read levels (Read Level 1 and Read Level 2) may fall within a range of threshold voltage levels of the memory cells connected to the reference word line Ref WL. The first and second read levels Read Level 1 and Read Level 2 for obtaining OCC1 and OCC2 may be smaller than the number of read levels VR1 to VR15 or VR1' to VR15' for reading data of memory cells. The read levels VR1 to VR15 or VR1' to VR15' for reading the data may be classified into lower read levels and higher read levels, wherein the lower read levels and the higher read levels may be different from each other.

The first read level 1 may be determined in advance according to a correlation with the lower read levels among the read levels VR1 to VR15 or VR1' to VR15' for reading the data of the memory cells. States of memory cells read by the lower read levels may be affected by disturbance deterioration relatively greater than retention deterioration, such that threshold voltages of the memory cells may change. Accordingly, OCC1 may have a property associated with a slight change due to retention deterioration.

The second read level 2 may be determined in advance according to a correlation with the higher read levels among the read levels VR1 to VR15 or VR1' to VR15' for reading the data of the memory cells. States of memory cells read by the higher read levels may be affected by retention deterioration relatively greater than disturbance deterioration such that the threshold voltages of the memory cells may change.

Figure 7:
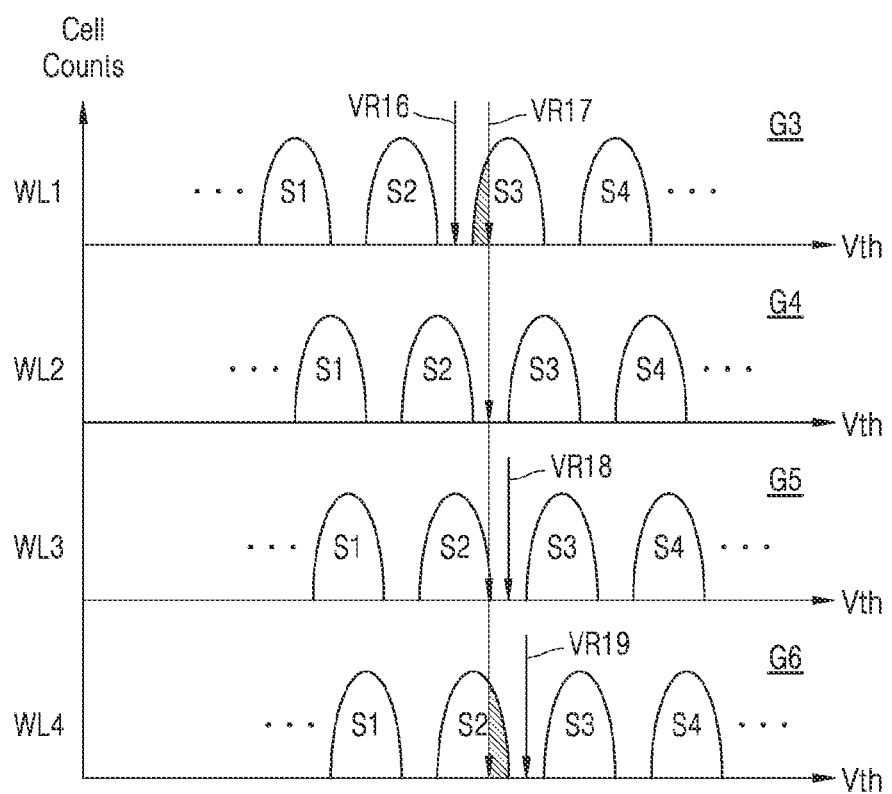

FIG. 7 includes a set of graphs G3, G4, G5 and G6 (collectively, "G3 to G6") illustrating threshold voltage distributions of memory cells respectively connected to the word lines WL1, WL2, WL3 and WL4 of FIG. 5. In FIG. 7, the graphs G3 to G6 represent distributions of threshold voltages of memory cells connected to the word lines WL1 to WL4, respectively. The horizontal axis represents the threshold voltages of the memory cells, and the vertical axis represents cell counts, that is, the number of memory cells. The word lines WL1 to WL4 of FIG. 7 may be some of word lines of the first memory block BLK1 described above with reference to FIGS. 3 and 5. In FIG. 7, only states S1 to S4 among the possible states of the memory cells are illustrated for the sake of clarity.

Referring to FIG. 7, the graphs G3 to G6 representing distributions of threshold voltages of the memory cells connected to the word lines WL1 to WL4 may be different from each other. In FIG. 7, it is assumed that a read level initially set to determine the states S2 and S3 is VR17 and that the read level VR17 is applied to all word lines. When the read level VR17 is applied to the word lines WL2 and WL3, the states S2 and S3 of the memory cells connected to the word lines WL2 and WL3 may be determined or identified. However, when the read level VR17 is applied to the word lines WL1 and WL4, an error occurs in the memory cells included in a shading area, and thus the states S2 and S3 of the memory cells connected to the word lines WL1 and WL4 may not be properly determined.

The states S2 and S3 may be determined or identified only when a read level VR16 different from the read level VR17 is applied to the word line WL1, and a read level VR19 different from the read level VR17 is applied to the word line WL4. That is, optimal read levels need to be applied to respective word lines. The read level VR16 needs to be applied to the word line WL1, the read level VR17 needs to be applied to the word line WL2, the read level VR18 needs to be applied to the word line WL3, and the read level VR19 needs to be applied to the word line WL4.

The state monitoring unit 131 may confirm OCC1 and OCC2 indicating a deterioration state of the first memory block BLK1 in which the word lines WL1 to WL4 are disposed. The state-based inference unit 132 may calculate the optimal read level VR16 for determining the states S2 and S3 based on OCC1 and OCC2 and a number of the word line WL1 of the first memory block BLK1. Similar to the word line WL1, the state-based inference unit 132 may calculate the optimal read levels VR17, VR18, and VR19 for determining the states S2 and S3 of the word lines WL2, WL3, and WL4 based on OCC1 and OCC2 and numbers of the word lines WL2, WL3, and WL4 of the first memory block BLK1. The state-based inference unit 132 may calculate the optimal read level VR16 for determining other states other than the states S2 and S3 based on OCC1 and OCC2 and numbers of the word lines WL1, WL2, WL3, and WL4 of the first memory block BLK1.

Figure 8:
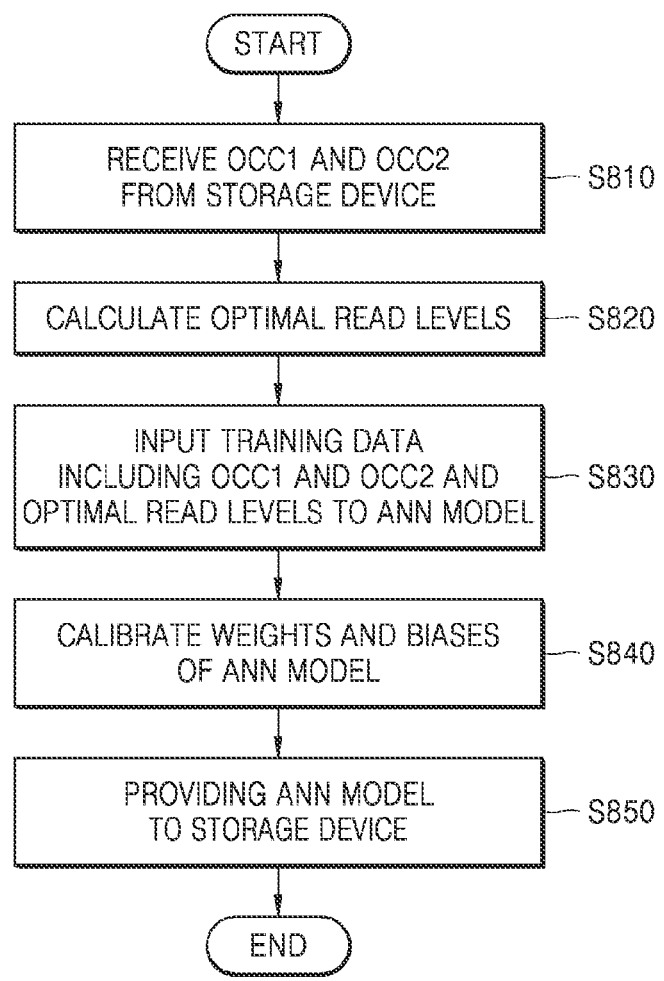
FIG. 8 is a flowchart summarizing in one example an operating method for the computing device 110 of FIG. 1.

FIG. 8 is a flowchart summarizing an operating method that may be performed by the computing device 110 of FIG. 1. Here, it is assume that the operating method includes the capability of learning (or training) an ANN model associated with the storage device 120. Thus, the method summarized by the flowchart of FIG. 8 relates to learning optimal read levels applied to word lines for each of blocks of NVM devices of the storage device 120 using the ANN model.

Referring to FIGS. 1, 6, and 8, the computing device 110 may receive OCC1 and OCC2 from the storage device 120 (S810). Here, the storage device 120 may read OCC1 and OCC2 for memory blocks of the NVM devices, and output the resulting OCC1 and OCC2 to the computing device 110 in response to a request from the computing device 110.

The computing device 110 may then calculate the optimal read levels VR1 to VR15 or VR1' to VR15' for reading data of memory cells based on the received OCC1 and OCC2 (S820).

The processor 112 of the computing device 110 may then generate training data including OCC1 and OCC2 as well as the optimal read levels VR1 to VR15 or VR1' to VR15' and store the resulting training data in the memory 114 (S830). Here, the processor 112 may provide the training data to the ANN model stored in the memory 114.

Example(s) of training data will be described in some additional detail with reference to FIGS. 9 and 10.

The processor 112 may calibrate weights and biases of the ANN model based on the training data (S840). Here, the weights and biases of the ANN model may be calibrated according to various deterioration conditions (e.g., retention times, number of reads, and/or various combinations of retention times and number of reads). In this regard, the ANN model may repeatedly perform operation S840 to receive input data of the training data and output the optimal read levels VR1 to VR15 or VR1' to VR15'.

The computing device 110 may provide the storage device 120 with the "trained" ANN model (S850). Accordingly, thereafter, the storage device 120 may execute the ANN model—as trained by the computing device 110—and apply the optimal read levels VR1 to VR15 or VR1' to VR15' to a target word line corresponding to a request from the host to thereby read data.

Figure 9:
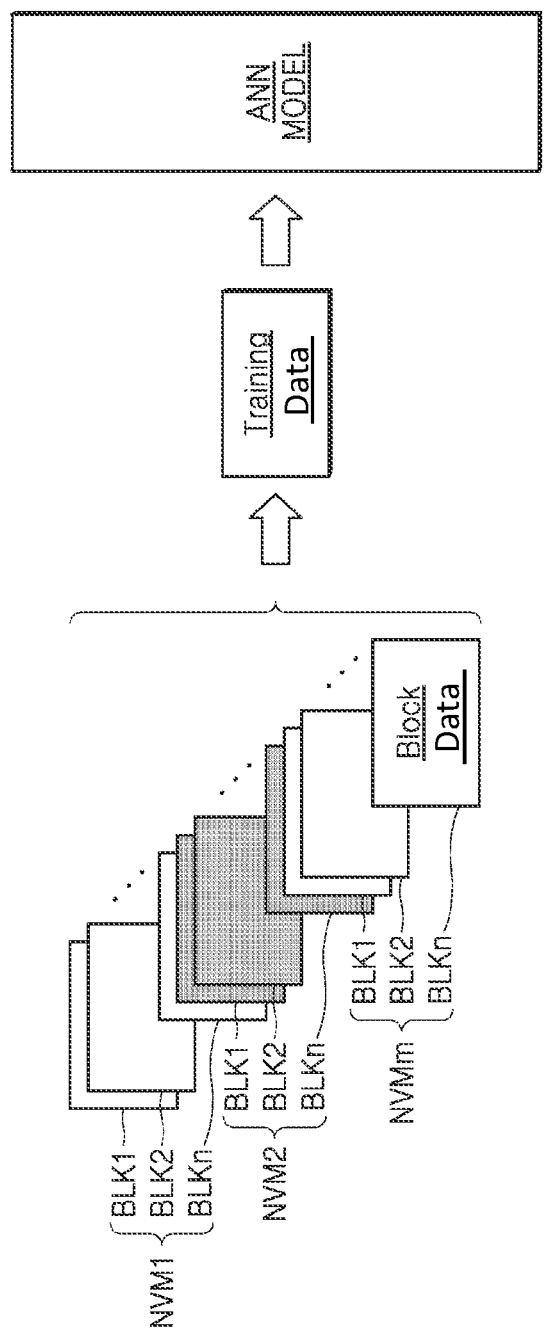
FIG. 9 is a conceptual diagram further illustrating exemplary training data resulting from method step S830 of the method described in relation to FIG. 8.

FIG. 9 is a conceptual diagram further illustrating in one example the step of inputting training data (S830) in the method of FIG. 8. For purposes of FIG. 9, it is assumed that the storage device 120 includes 'm' NVM devices, and one NVM device includes 'n' memory blocks, wherein each of 'm' and 'n' is an integer greater than 1.

Referring to FIG. 9, the processor 112 may generate block data respectively corresponding to the 'n' memory blocks of the 'm' NVM devices. Thus, the training data may include multiple groups of block data that may be stored in the memory 114 and ultimately applied (or input) to the ANN model.

FIG. 10 is a table conceptually listing block data groups of the training data of FIG. 9. The listing of block data groups in FIG. 10 relates to the first memory block BLK1 of the NVM device 141.

Referring to FIGS. 1, 6, 8, 9 and 10, the block data may include input data corresponding to input features and output data corresponding to labels. The input data may include OCC1 and OCC2 of the reference word line Ref WL and numbers of word lines of the first memory block BLK1. The output data may include optimal read level sets to be applied to the word lines of the first memory block BLK1, respectively. The optimal read level sets may be the optimal read levels VR1 to VR15 or VR1' to VR15' calculated in step (S820) of the method described in relation to FIG. 8, for example. Any one of the word lines of the first memory block BLK1 may be selected as the reference word line Ref WL. The reference word line Ref WL may be selected as a word line capable of well representing a deterioration state of the first memory block BLK1 among the word lines of the first memory block BLK1. In FIG. 10, among the word lines WL1 to WL64, the word line WL4 is selected as the reference word line Ref WL.

A number of the word line WL5 may constitute the input data together with OCC1 and OCC2 of the word line WL4 which is the reference word line Ref WL. Each of numbers of the other word lines WL1 to WL3 and WL6 to WL64 may also constitute the input data together with OCC1 and OCC2 of the word line WL4. That is, OCC1 and OCC2 of the reference word line Ref WL may be applied to other word lines of the first memory block BLK1 including the reference word line Ref WL, respectively.

For example, an ANN model may be trained by the processor 112 to receive OCC1 and OCC2 of the word line WL4 and a number of the word line WL4 and output optimal read level sets of the word line WL4 calculated in method step (S820). The ANN model may be trained by the processor 112 to receive OCC1 and OCC2 of the word line WL4 other than OCC1 and OCC2 of the word line WL5 and a number of the word line WL5 and output optimal read level sets of the word line WL5 calculated in method step (S820). The optimal read level sets of the word line WL5 will be different from the optimal read level sets of the word line WL4.

Figure 11:
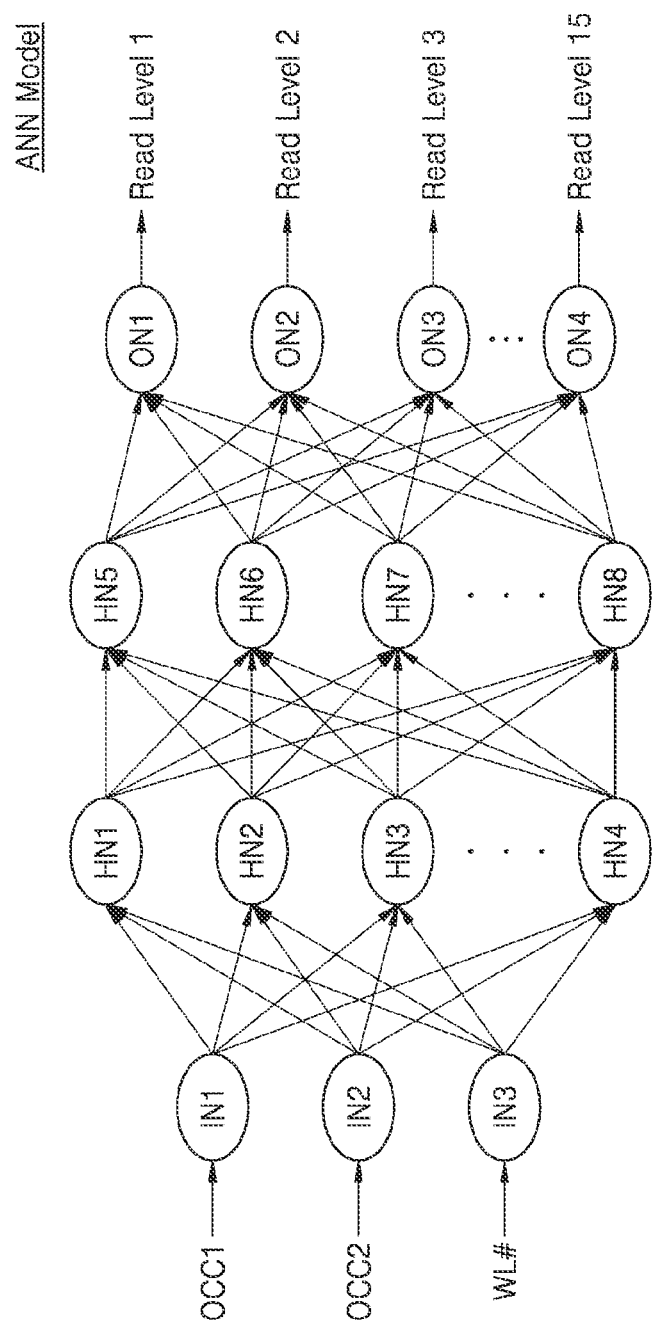
FIG. 11 is a conceptual diagram illustrating a possible relational structure for the artificial neural network (ANN) model of FIG. 1.

FIG. 11 is a conceptual diagram illustrating an exemplary, relational structure for the ANN model of FIG. 1. Thus, the diagram of FIG. 11 illustrates an ANN model including OCC1 and OCC2 of the reference word line Ref WL and outputting the optimal read levels VR1 to VR15 or VR1' to VR15' of a QLC. In the illustrated example of FIG. 11, the ANN model includes input nodes IN1, IN2 and IN3 (constituting an input layer), hidden nodes HN1, HN2, HN3, HN4, HN5, HN6, HN7 and HN8 (constituting at least one hidden layer), and output nodes ON1, ON2, ON3 and ON4 (constituting an output layer).

OCC1, OCC2, and a word line number WL #may be input to each of the input nodes IN1, IN2 and IN3. The hidden nodes HN1 to HN6 may apply weights and biases between the nodes IN1, IN2 and IN3, HN1 to HN8, and ON1 to ON4 to OCC1, OCC2 and the word line number WL #input to the input nodes IN1 to IN3. The output nodes ON1 to ON4 may output the optimal read levels VR1 to VR15 or VR1' to VR15'.

Figure 12:
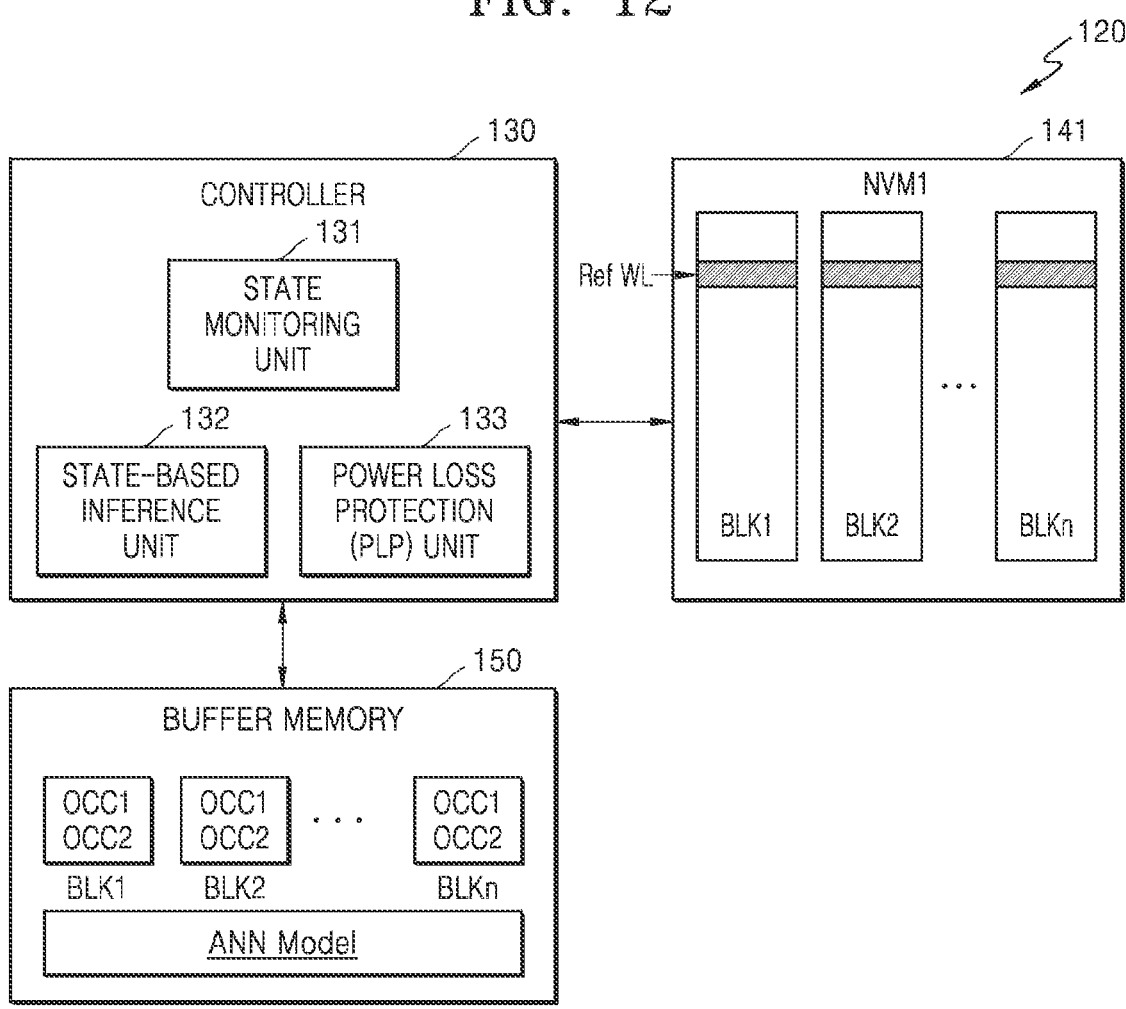
FIG. 12 is a block diagram illustrating in another example the storage device 120 of FIG. 1.

FIG. 12 is a block diagram further illustrating in one example the storage device 120 of FIG. 1.

Referring to FIG. 12, the controller 130 may include the state monitoring unit 131, the state-based inference unit 132, and the PLP unit 133. The state monitoring unit 131 may monitor a deterioration state for each of memory blocks of the NVM devices. The state monitoring unit 131 may read the memory cells connected to the reference word line Ref WL of the first memory block BLK1 of the NVM device 141 using the first and second read levels Read Level 1 and Read Level 2. The state monitoring unit 131 may apply the first and second read levels Read Level 1 and Read Level 2 to the reference word line Ref WL of the first memory block BLK1 and monitor OCC1 and OCC2 of the reference word line Ref WL. The state monitoring unit 131 may store the monitored OCC1 and OCC2 of the first memory block BLK1 in the buffer memory 150. The state monitoring unit 131 may apply the first and second read levels Read Level 1 and Read Level 2 to the reference word lines Ref WL of each of the remaining memory blocks BLK2 to BLKn, monitor OCC1 and OCC2 of the remaining memory blocks BLK2 to BLKn and store OCC1 and OCC2 of the remaining memory blocks in the buffer memory 150.

The state-based inference unit 132 may infer operating conditions for accessing each of the memory blocks BLK1 to BLKn based on the deterioration state of the memory blocks BLK1 to BLKn in the NVM device 141 monitored by the state monitoring unit 131. For example, the operating conditions may include levels (sizes) of voltages applied to the memory blocks BLK1 to BLKn, times when the voltages are applied to the memory blocks BLK1 to BLKn, and periods in which the voltages are applied to the memory blocks BLK1 to BLKn. The state-based inference unit 132 may execute an ANN model trained and provided by the computing device 110 to infer the operating conditions.

The buffer memory 150 may store OCC1 and OCC2 for each of the memory blocks BLK1 to BLKn in the NVM device 141. In some embodiments, the number of OCCs stored in the buffer memory 150 may be at least two, and may be determined based on the number of NVM devices included in the storage device 120 and the number of memory blocks in each of the NVM devices.

The PLP unit 133 may perform a PLP operation when a sudden power off (SPO) occurs during a write operation executed by the storage device 120. The PLP operation may be performed to complete the write operation of data intended by a host by determining whether to successively write unwritten data to the same memory block following already written data, that is, whether successive writing is possible after power is restored following the SPO.

Figure 13:
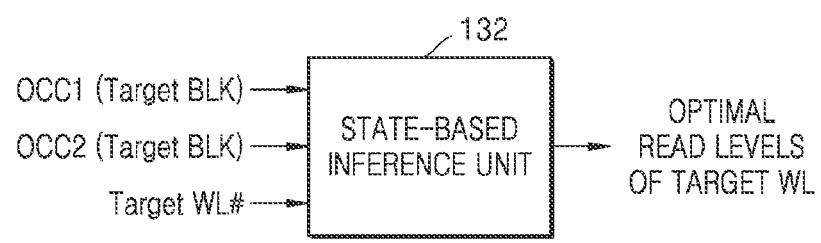
FIG. 13 is a block diagram illustrating in one example the operation of the state-based inference unit 132 of FIG. 12.

FIG. 13 is a block diagram illustrating an exemplary operation of the state-based inference unit 132 of FIG. 12. In FIG. 13, it is assumed that the controller 130 receives first and second read requests from a host (which may be different from the computing device 110 of FIG. 1) and accesses a target word line of the first memory block BLK1 in the NVM device 141 to process the first and second read requests. The target word line may be an arbitrary word line among word lines of the first memory block BLK1 and may or may not be the reference word line Ref WL.

Referring to FIGS. 12 and 13, the controller 130 may receive the first read request and access a first target word line of the first memory block BLK1 to process the first read request. The state-based inference unit 132 may infer, predict, or calculate optimal first read levels applied to the first target word line based on OCC1 and OCC2 stored in the buffer memory 150. The state-based inference unit 132 may input OCC1 and OCC2 1 and a number of the first target word line of the first memory block BLK into an ANN model and obtain the optimal first read levels calculated by the ANN model.

The controller 130 may receive the second read request and access a second target word line of the first memory block BLK1 to process the second read request. The state-based inference unit 132 may input OCC1 and OCC2 and a number of the second target word line of the first memory block BLK1 into the ANN model and obtain optimal second read levels calculated by the ANN model. Because the number of the first target word line and the number of the second target word line are different from each other, the optimal first read levels and the optimal second read levels may be different from each other.

Figure 14:
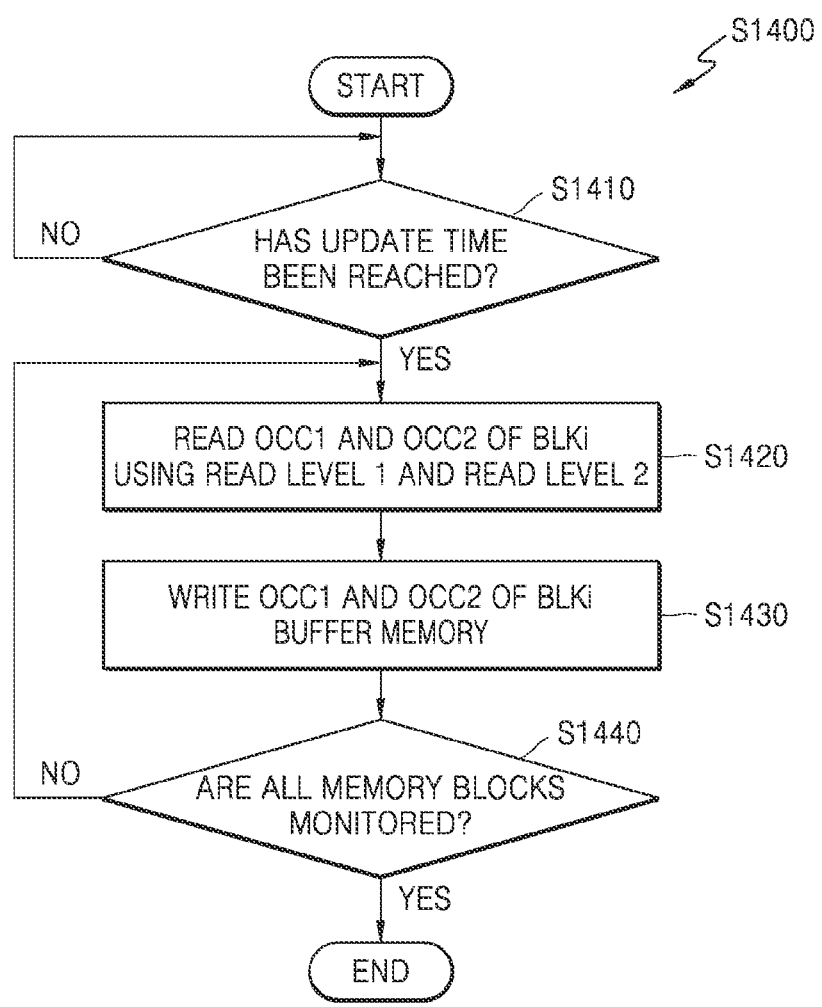
FIGS. 14 and 15 are respective flowcharts summarizing in various examples operating methods for the storage device 120 of FIG. 12.

FIG. 14 is a flowchart summarizing in one example, an operating method for the storage device 120 of FIG. 12. The operating method for the storage device illustrated in FIG. 14 may be executed, for example, during background operation(s) for the storage device 120 of FIG. 12, and may be executed during a background operation that periodically monitors OCCs of the memory blocks BLK1 to BLKn of the NVM device 141.

Referring to FIGS. 12 and 14, the controller 130 may be used to determine whether an update time for identifying OCC1 and OCC2 of the memory blocks BLK1 to BLKn has reached (S1410). Here, the controller 130 may periodically update OCC1 and OCC2 in the buffer memory 150 by repeating looped operations S1420, S1430 and S1440 when a time elapses by a previously determined update period. That is, the controller 130 may further determine whether or not a request from a host (which may be different from the computing device 110 of FIG. 1) has been received. The operation of updating and monitoring OCC1 and OCC2 may be performed without a request from the host as a background operation S1400 associated with the storage device 120. In this manner, the storage device 120 may monitor and store OCC1 and OCC2, while maintaining a quality of service (QoS) with respect to the host.

In operation S1420, the controller 130 may read OCC1 and OCC2 using the first and second read levels Read Level 1 and Read Level 2. The state monitoring unit 131 may apply the first and second read levels Read Level 1 and Read Level 2 to the reference word line Ref WL of the first memory block BLK1 and monitor OCC1 and OCC2 of the reference word line Ref WL. The controller 130 may transmit a command (or a request) for obtaining OCC1 and OCC2 to the NVM device 141. The controller 130 may receive read data from the NVM device 141 that receives the command, and calculate OCC1 and OCC2 based on the read data.

In operation S1430, the controller 130 may store OCC1 and OCC2 of the first memory block BLK1 monitored in operation S1420 in the buffer memory 150. In operation S1420, all word lines of the first memory block BLK1 are not read, and only the reference word line Ref WL is read using the first and second read levels Read Level 1 and Read Level 2, and thus, an amount of OCC1 and OCC2 stored in the memory 150 may be reduced. The state monitoring unit 131 may compare new OCC1 and OCC2 of the first memory block BLK with previous OCC1 and OCC2 of the first memory block BLK1 stored in the buffer memory 150. The state monitoring unit 131 may store the new OCC1 and OCC2 instead of the previous OCC1 and OCC2 based on a comparison result. The state monitoring unit 131 may adjust an update period for monitoring OCC1 and OCC2 based on the comparison result.

In operation S1440, the controller 130 may determine whether all the memory blocks BLK1 to BLKn of the NVM device 141 are monitored. The controller 130 may determine whether all memory blocks of all NVM devices included in the storage device 120 are monitored. When all memory blocks are not monitored, the controller 130 may repeatedly perform operations S1420, S1430, and S1440 (hereafter, "S1420 to S1440") until all memory blocks are monitored. During the background operation in which the controller 130 periodically performs operations S1420 and S1430 to monitor OCC1 and OCC2, the order in which the memory blocks are monitored and accessed may be determined in advance by the controller 130.

Figure 15:
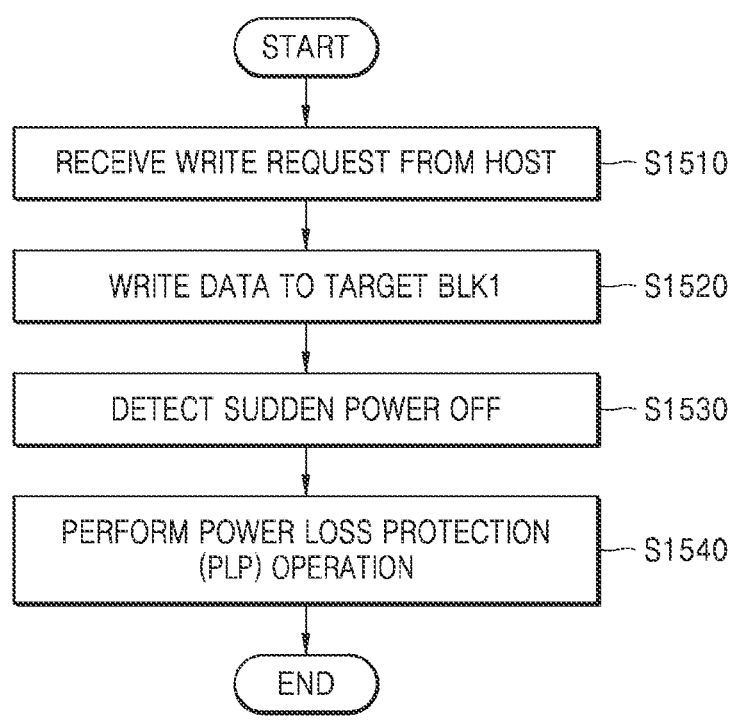

FIG. 15 is a flowchart summarizing in another example, an operating method for the storage device 120 of FIG. 12. The operating method of the storage device 120 of FIG. 15 relates to a method of performing a PLP operation when a SPO occurs during a write operation in response to a request by the computing device 110 of FIG. 1.

Referring to FIGS. 1, 12 and 15, the controller 130 of the storage device 120 may receive a write request from a host (which may be different from the computing device 110 of FIG. 1) (S1510). The host may request the storage device 120 to store data. When the controller 130 receives the write request from the host during a background operation (S1400) of performing operations S1420 to S1440 described above in FIG. 14, the controller 130 stops operations S1420 to S1440, processes the write request from the host, and then again performs operations S1420 to S1440. Also, the controller 130 may first process the write request from the host when there is the write request from the host even though an update time reaches in operation S1410 described above.

The controller 130 may perform the write operation of writing (or programming) data to a target block corresponding to the write request from the host, for example, the first memory block BLK1 (S1520). The controller 130 may perform a number of program loops until the program is completed according to incremental step pulse programming (ISPP). As program loops increase, a program voltage of a selected memory cell may increase step by step.

The controller 130 may detect a SPO during the write operation (S1530). Here, the controller 130 should be able to retain data being written even during the SPO.

The controller 130 may perform the PLP operation when sudden power off in operation S1530 occurs (S1540). The PLP operation means an operation of completing the write operation of data intended by a host by determining whether to successively write unwritten data to the same memory block following already written data, that is, whether successive writing is possible after power is restored again.

For example, the controller 130 may find a last page to which data is written in a block to which the data is written during the write operation. The controller 130 may check a time from a time when the data is written to the last page to a current time, that is, a program time. The controller 130 may determine whether successive writing is possible or impossible by comparing the program time with a reference value. When the reference value is the minimum reference value, the controller 130 may determine that successive writing is possible in the case where the program time is greater than the minimum reference value, and may determine that successive writing is impossible in the case where the program time is less than the minimum reference value. Conversely, when the reference value is the maximum reference value, the controller 130 may determine that successive writing is possible in the case where the program time is less than the maximum reference value, and may determine that successive writing is impossible in the case where the program time is greater than the maximum reference value. Exemplary PLP operation(s) will be described in some additional detail with reference to FIGS. 16 and 17.

Figure 16:
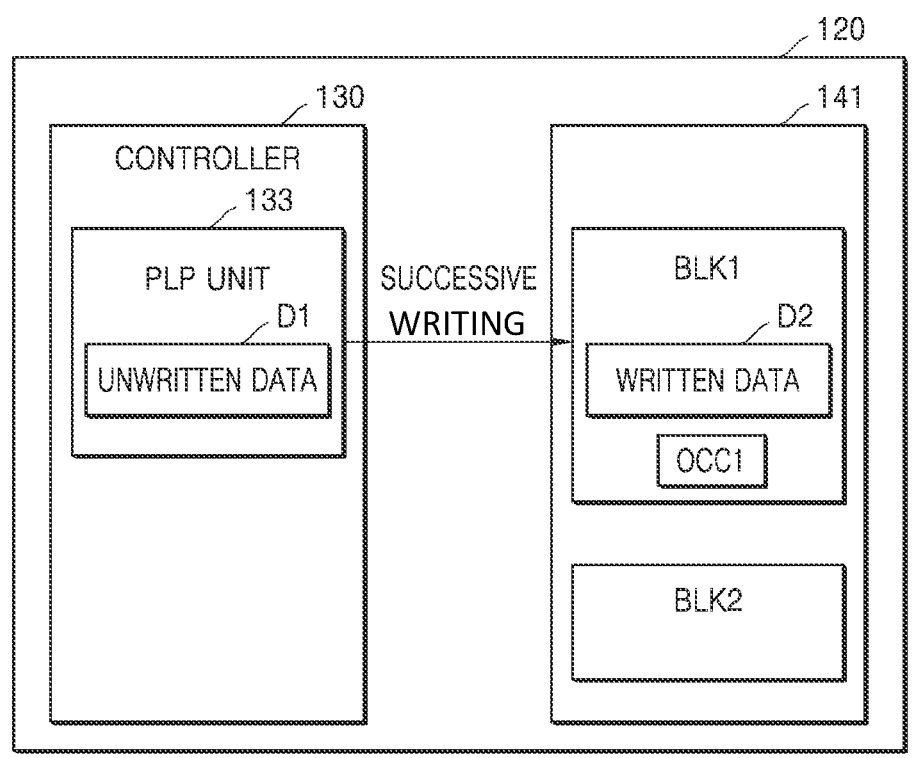
FIGS. 16 and 17 are block diagrams further illustrating in various examples a power loss protection (PLP) operation (e.g., method step S1540 of FIG. 15) according to embodiments of the inventive concept.
Figure 17:
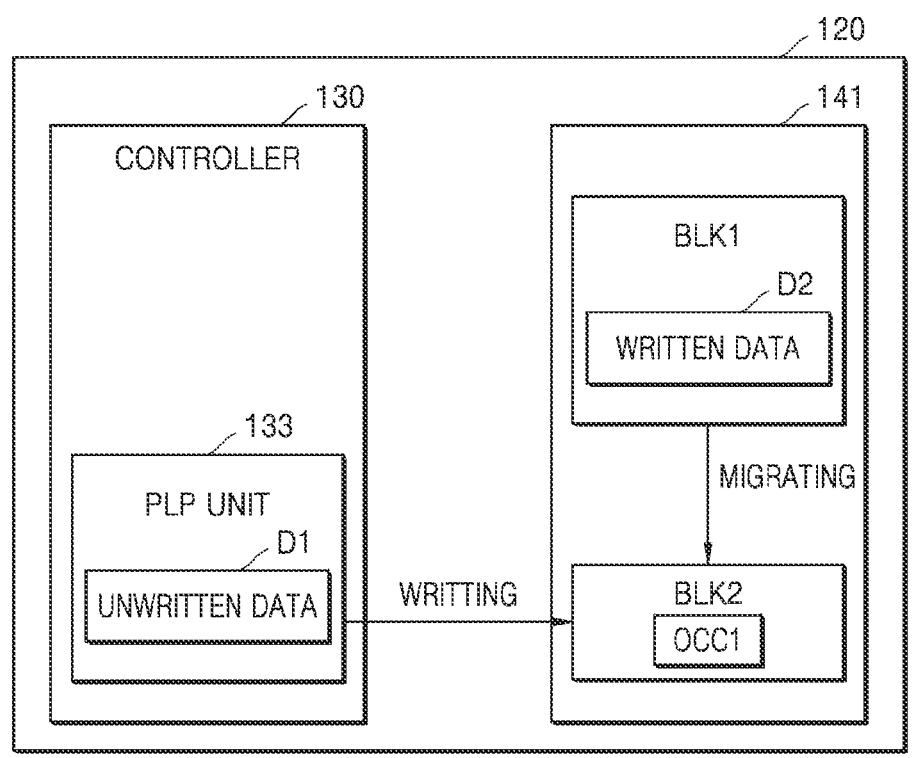

FIGS. 16 and 17 are respective block diagrams illustrating a PLP operation, such as the one described in method step S1540 of FIG. 15.

In FIGS. 16 and 17, the NVM device 141 may include the first memory block BLK1 and the second memory block BLK2. The first memory block BLK1 may be a memory block to which the data (DATA) received from a host is written, and the second memory block BLK2 may be an empty memory block to which no data is written. FIG. 16 illustrates an operation when successive writing is possible, and FIG. 17 illustrates an operation when successive writing is impossible.

Referring to FIG. 16, when a SPO occurs during a write operation, only part of the data may be written to the first memory block BLK1 and another part of the data may remain unwritten to the first memory block BLK1. Hence, the PLP unit 133 of the controller 130 may retain the unwritten part the data (e.g., first data D1) using auxiliary power. The written part of the data (e.g., second data D2) may now be located in the first memory block BLK1. Hence, as the result of the PLP operation, the original data received from the host may be divided into parts—e.g., the first data D1 and the second data D2.

During the PLP operation, when the controller 130 determines that successive writing is possible, the first data D1 may be successively written to the first memory block BLK1. Because the data including the first data D1 and the second data D2 are entirely (or completely) written to the first memory block BLK1 in a normal manner by the host, the objective of PLP may be achieved. Hence, for purposes of the PLP operation, the first memory block BLK1 may be referred to as a PLP area.

Referring to FIG. 17, it is alternately assumed that during the PLP operation, the controller 130 determines that successive writing is impossible for some reason. Accordingly, the PLP unit 133 of the controller 130 may write the data to the second memory block BLK2 that is empty, instead of the first memory block BLK1 using auxiliary power. In addition, the PLP unit 133 may migrate the second data D2 included in the first memory block BLK1 to the second memory block BLK2. In this regard, the term "migrating" denotes a copying and storing of the data remains in the first memory block BLK1 (as it is), such that the data may be located in the second memory block BLK2. Thereafter, an erase operation may be performed on the first memory block BLK1.

The first data D1 and the second data D2, which are data received from the host, may be transferred to the second memory block BLK2, and thus, the objective of PLP may be achieved. In this regard, for purposes of the PLP operation, the first memory block BLK1 may be referred to as a PLP area. In this case, although the first memory block BLK1 was designated by the host, the data is instead written to the second memory block BLK2 due to the intervention of the PLP operation.

In this regard, the controller 130 may include a mapping table managing mapping between a logical address used by the host and a physical address used in the NVM device 141 of a nonvolatile memory in an FTL. The mapping table may be configured such that a physical address of the first memory block BLK1 is mapped to a physical address of the second memory block BLK2. Thereafter, a command with respect to the first memory block BLK1 designated by the host may be executed in the second memory block BLK2 with reference to the mapping table.

As a result, OCC1 values for the memory blocks BLK1 to BLKn of the NVM devices may be stored in the PLP area of FIGS. 16 and 17.

Examples of the first memory block BLK1 and/or the second memory block BLK2, will now be is described with reference to FIG. 18.

Figure 18:
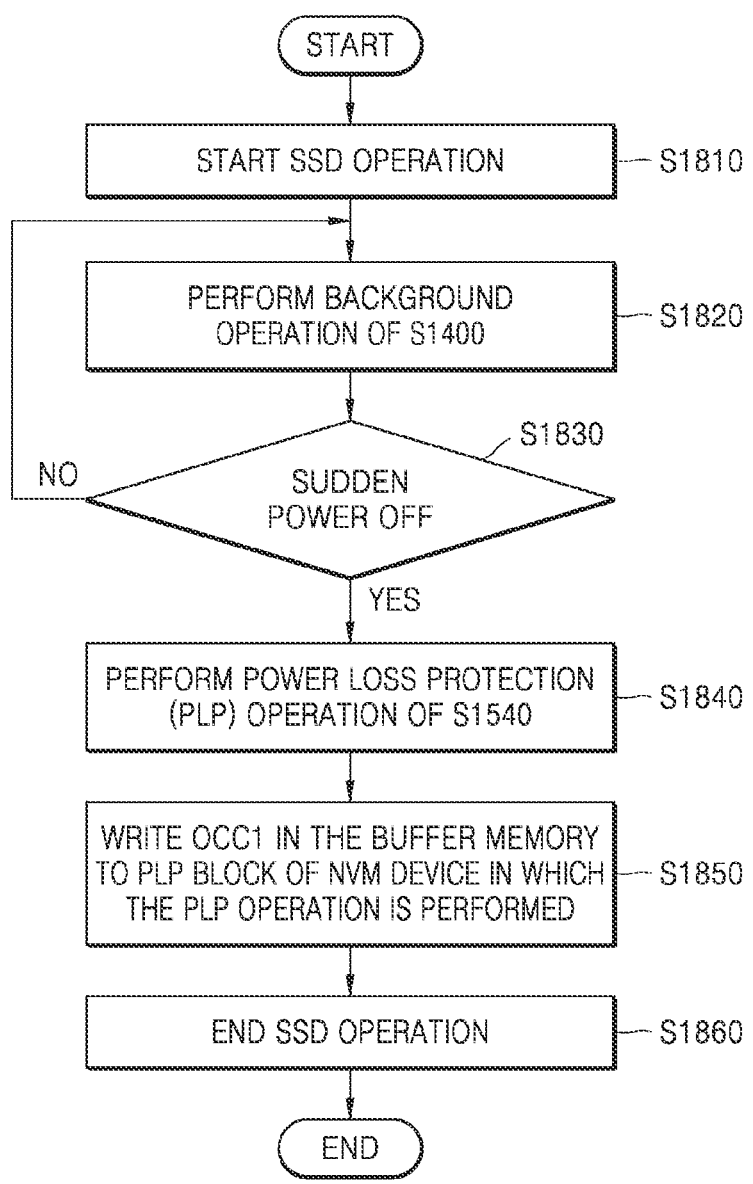

FIG. 18 is a flowchart summarizing in still another example, an operating method for the storage device 120 of FIG. 12. The operating method for the storage device 120 described in relation to FIG. 18 relates to a method of storing OCC1 values for the memory blocks BLK1 to BLKn of the NVM devices in a PLP area when SPO occurs. Here, it is further assumed that the storage device 120 is the SSD 120.

Referring to FIGS. 12 and 18, the operation of the SSD 120 starts (S1810). At some point in time, the SSD 120 may perform the background operation S1400 described above with respect to FIG. 14 (S1820). The SSD 120 may monitor OCC1 and OCC2 for memory blocks during the background operation performed by the controller 130 and store monitored OCC1 and OCC2 values in the buffer memory 150.

So long as a SPO does not occur, the SSD 120 continues the background operation, however, upon determining that a sudden power off has occurred in the SSD 120 (S1830=YES), the SSD 120 may perform the PLP operation e.g., operation S1540 described above with reference to FIG. 15) (S1840). During the PLP operation, the SSD 120 may achieve the objective of PLP through successive writing to the first memory block BLK1 intended by a host when successive writing is possible using auxiliary power, or through writing and migrating to the second memory block BLK2 when successive writing is not possible. During the PLP operation, the first memory block BLK1 or the second memory block BLK2 may be used as a PLP area.

Then the SSD 120 may store OCC1 and OCC2 for the memory blocks stored in the buffer memory 150 (e.g., during the background operation S1400 described above in FIG. 14) in the PLP area where the PLP operation (S1850). Here, OCC1 has the property of a slight change due to retention deterioration, and an OCC1 value may not change even though time elapses. The SSD 120 may store OCC1 in a PLP area of the NVM device 141, for example, in the first memory block BLK1 or the second memory block BLK2 by using auxiliary power.

Thereafter, the SSD 120 may be powered off (S1860).

Subsequent to the foregoing, a method of powering (or re-powering) on the SSD 120, like the method described with reference to FIG. 19, may be performed.

Figure 19:
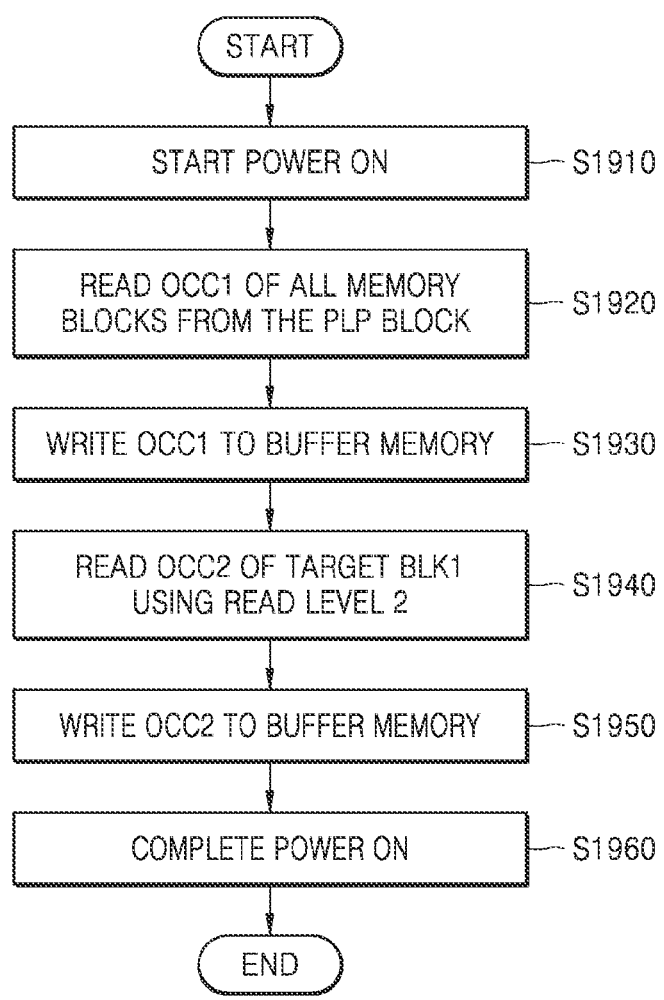

FIG. 19 is a flowchart illustrating in still another example, an operating method for the storage device 120 of FIG. 12 that may be used to restore power to the storage device 120.

Referring to FIGS. 12 and 19, the SSD 120 may be powered on (S1910). The SSD 120 needs to store initialization information including product contents in the NVM device 141 and read the initialization information at booting when power is applied. The initialization information may include protect information about whether program/erase is prohibited, trimming data for trimming an operating voltage level in an operation mode, column repair information for relieving a failed bit line, and bad block information including defective memory cells. The trimming data is data for setting operation modes of each of the NVM devices, i.e., voltage adjustment in a read operation, a program operation, and an erase operation, as well as adjustment of a sense amplifier or a page buffer or optimization of a reference cell.

Accordingly, the SSD 120 may read OCC1 values for memory blocks stored in a PLP area (e.g., stored during the method step S1850 of FIG. 18) (S1920).

That is, the SSD 120 may store the read OCC1 values for memory blocks in the buffer memory 150 (S1930). In this regard, the time required to perform operations S1920, S1930 may be significantly shorter than a time required to apply the first read level Read Level 1 to the reference word line Ref WL for all of the memory blocks in order to obtain OCC1 for the reference word line Ref WL. Accordingly, the read performance of the SSD 120 may be markedly improved.

The, the SSD 120 may read OCC2 required for an optimal read level in the read operation on the NVM device 141 which is one of the NVM devices (S1940). The SSD 120 may apply the second read level Read Level 2 to the reference word line Ref WL of a target memory block, for example, the first memory block BLK1, in the NVM device 141 and obtain OCC2 of the reference word line Ref WL.

The SSD 120 may store OCC2 (e.g., as read during the method step S1940) in the buffer memory 150 (S1950). The buffer memory 150 may store OCC1 read from the PLP area and OCC2 read using the second read level Read Level 2 during method steps S1920 and S1930.

When OCC1 and OCC2 are stored in the buffer memory 150, the SSD 120 may complete the power-on operation (S1960). And when the power-on operation for the SSD 120 is completed, the operation of the SSD 120 (e.g., method step S1810 described above with respect to FIG. 18) may start.

FIG. 20 is a flowchart summarizing in yet another example, an operating method for the storage device 120 of FIG. 12. Here, the operating method for the storage device 120 of FIG. 20 relates to a read operation in response to a read request received from the computing device 110.

Referring to FIGS. 1, 12, and 20, the controller 130 of the storage device 120 may receive a read request from a host (which may be different from the computing device 110 of FIG. 1) (S2010). The host may request to read data from the storage device 120. When the controller 130 receives the read request from the host during the background operation (S1400) of performing operations S1420 to S1440 described above with respect to FIG. 14, the controller 130 stops operations S1420 to S1440, processes the read request from the host, and then performs operations S1420 to S1440 again. Also, the controller 130 may first process the read request from the host when there is the read request from the host even though an update time reaches in operation S1410 described above.

The controller 130 may input OCC1 and OCC2 and a number of a target word line of a target block of the target NVM device 141 corresponding to the read request from the host, for example, the first memory block BLK1, into the state-based inference unit 132 (S2020). The state-based inference unit 132 may calculate optimal read levels to be applied to the target word line based on OCC1 and OCC2 and the number of the target word line of the first memory block BLK1. The controller 130 may provide optimal read levels to the NVM device 141.

The controller 130 may read data of memory cells connected to the target word line of the NVM device 141 using the optimal read levels output from the state-based inference unit 132 (S2030). The NVM device 141 may apply the optimum read levels provided from the controller 130 to the target word line and output data of memory cells connected to the target word line to the controller 130.

The controller 130 may process the read request from the host by transmitting the data read in operation S2030 to the host (S2040). The storage device 120 may infer or calculate the optimal read levels to be applied to the target word line even when the NVM device 141 deteriorates, thereby minimizing the number of read retries and delaying a read reclaim operation on a deteriorated memory block as much as possible.

While the inventive concept has been particularly shown and described with reference to certain embodiments thereof, it will be understood that various changes in form and details may be made therein without departing from the spirit and scope of the following claims.

What is claimed is:

1. A storage device comprising:
 a nonvolatile memory comprising memory blocks including a first memory block and a second memory block;
 a buffer memory configured to apply a first read voltage having a first read level and a second read voltage having a second read level higher than the first read level to memory cells connected to a reference word line for each of the memory blocks, and store a first ON cell count (OCC1) indicating a number of memory cells turned ON by the first read voltage and a second ON cell count (OCC2) indicating number of memory cells turned ON by the second read voltage among the memory cells connected to the reference word line; and
 a controller storing the OCC1 for each of the memory blocks in a power loss protection (PLP) area of the nonvolatile memory when a sudden power off occurs in the storage device,
 wherein the controller is further configured to select the second memory block as the PLP area when successive writing of data to the first memory block is not possible and store the OCC1 for each of the memory blocks in the PLP area, when the sudden power off occurs while writing data to the first memory block.

2. The storage device of claim 1, wherein the controller is further configured to select the first memory block as the PLP area when successive writing of data to the first memory block is possible and store the OCC1 for each of the memory blocks in the PLP area when the sudden power off occurs while writing data to the first memory block.

3. The storage device of claim 1, wherein the controller is further configured to write first data among the data to the second memory block, thereafter migrate second data among the data from the first memory block to the second memory block and perform an erase operation on the first memory block.

4. The storage device of claim 1, wherein the controller is further configured to store the OCC1 in the buffer memory, and store the OCC2 monitored at the second read voltage among the memory cells connected to the reference word line for each of the memory blocks in the buffer memory when the storage device is powered on and booted, and thereafter read the OCC1 for each of the memory blocks stored in the PLP area.

5. The storage device of claim 1, wherein the controller is further configured to perform a background operation that periodically monitors the OCC1 and the OCC2 to update the buffer memory.

6. The storage device of claim 5, wherein the controller is further configured to stop the background operation when a write request to write data to the first memory block or a read request to read data from the first memory block is received from a host.

7. The storage device of claim 6, wherein the controller is further configured to calculate read levels used to read the data based on the OCC1, the OCC2 and a number of a target word line of the first memory block in response to the read request, and thereafter provide the calculated read levels to the nonvolatile memory to be applied to the target word line.

8. The storage device of claim 1, wherein the controller is further configured to determine the first read level according to a correlation with lower read levels among the read levels for determining data of the memory cells connected to the reference word line, and determine the second read level according to a correlation with higher read levels among the read levels.

9. A storage device comprising:
a nonvolatile memory comprising memory blocks including a first memory block and a second memory block;
a buffer memory configured to apply a first read voltage having a first read level and a second read voltage having a second read level higher than the first read level to memory cells connected to a reference word line for each of the memory blocks, and store a first ON cell count (OCC1) indicating a number of memory cells turned ON by the first read voltage, a second ON cell count (OCC2) indicating a number of memory cells turned ON by the second read voltage among the memory cells connected to the reference word line, and an artificial neural network (ANN) model; and
a controller configured to input the OCC1, the OCC2, and a number of a target word line for a target memory block among the memory blocks to the ANN model, calculate read levels for determining data of memory cells connected to the target word line, and store the OCC1 for each of the memory blocks in a power loss protection (PLP) area of the nonvolatile memory when a sudden power off occurs in the storage device,
wherein the ANN model is configured to receive input data including the OCC1 and the OCC2 for each of the memory blocks and numbers for word lines of the memory blocks, calibrate weights and biases of the ANN model, and output read levels used to read data of memory cells connected to the word lines.

10. The storage device of claim 9, wherein the weights and biases of the ANN model are calibrated according to deterioration conditions related to at least one of data retention times for each of the memory blocks and a number of read operations directed to each of the memory blocks.

11. The storage device of claim 9, wherein the controller is further configured to determine the first read level according to a correlation with lower read levels among the read levels for determining data of the memory cells connected to the reference word line, and determine the second read level according to a correlation with higher read levels among the read levels.

12. An operating method for a storage device including a nonvolatile memory comprising memory blocks including a first memory block and a second memory block, the operating method comprising:
monitoring a first ON cell count (OCC1) and a second ON cell count (OCC2) for each of the memory blocks, wherein the OCC1 applies a first read voltage having a first read level to memory cells connected to a reference word line for each of the memory blocks and indicates a number of memory cells turned ON by the first read voltage, and the OCC2 applies a second read voltage having a second read level higher than the first read level to the memory cells connected to the reference word line for each of the memory blocks and indicates a number of memory cells turned ON by the second read voltage among the memory cells connected to the reference word line;
storing the OCC1 and the OCC2 for each of the memory blocks in a buffer memory;
storing the OCC1 for each of the memory blocks in a power loss protection (PLP) area of the nonvolatile memory when a sudden power off of the storage device occurs; and
when the storage device is powered on and booted after the sudden power off, reading the OCC1 for each of the memory blocks stored in the PLP area, storing the OCC1 for each of the memory blocks in the buffer memory, and storing the OCC2 monitored at the second read voltage among the memory cells connected to the reference word line for each of the memory blocks in the buffer memory.

13. The operating method of claim 12, further comprising:
inputting the OCC1, the OCC2 and a number of a target word line of a target memory block among the memory blocks to an artificial neural network (ANN) model; and
outputting read levels for determining data of memory cells connected to the target word line as an output of the ANN model.

14. The operating method of claim 12, further comprising:
selecting the first memory block as the PLP area when successive writing of data to the first memory block is possible and storing the OCC1 for each of the memory blocks in the PLP area when the sudden power off occurs while writing data to the first memory block.

15. The operating method of claim 12, further comprising:
selecting the second memory block as the PLP area when successive writing of data to the first memory block is not possible and storing the OCC1 for each of the memory blocks in the PLP area when the sudden power off of the storage device occurs while writing data to the first memory block.

16. The operating method of claim 12, further comprising:
performing a background operation that periodically monitors the OCC1 and the OCC2 to update the buffer memory.

17. The operating method of claim 16, further comprising:
stopping the background operation when a request to access the memory blocks is received from a host.

18. The operating method of claim 12, wherein after said storing the OCC2 monitored at the second read voltage, further comprising reading the OCC1 for each of the memory blocks stored in the PLP area.

* * * * *